United States Patent
Abe et al.

(10) Patent No.: US 9,406,573 B2
(45) Date of Patent: Aug. 2, 2016

(54) EXPOSURE MASK FABRICATION METHOD, EXPOSURE MASK FABRICATION SYSTEM, AND SEMICONDUCTOR DEVICE FABRICATION METHOD

(71) Applicant: NUFLARE TECHNOLOGY, INC., Yokohama (JP)

(72) Inventors: Takayuki Abe, Kanagawa (JP); Tetsuo Yamaguchi, Kanagawa (JP)

(73) Assignee: NUFLARE TECHNOLOGY, INC., Yokohama (JP)

(*) Notice: Subject to any disclaimer, the term of this patent is extended or adjusted under 35 U.S.C. 154(b) by 0 days.

(21) Appl. No.: 14/591,106

(22) Filed: Jan. 7, 2015

(65) Prior Publication Data

US 2015/0198896 A1    Jul. 16, 2015

(30) Foreign Application Priority Data

Jan. 16, 2014  (JP) ................................. 2014-006241

(51) Int. Cl.
*H01L 21/66* (2006.01)
*G03F 1/84* (2012.01)

(52) U.S. Cl.
CPC . *H01L 22/20* (2013.01); *G03F 1/84* (2013.01)

(58) Field of Classification Search
CPC ................................ H01L 22/20; G03F 1/84
See application file for complete search history.

(56) References Cited

U.S. PATENT DOCUMENTS

| 6,765,673 | B1 | 7/2004 | Higashikawa | |
|---|---|---|---|---|
| 7,171,637 | B2 * | 1/2007 | Stivers | B82Y 10/00 716/52 |
| 7,927,766 | B2 * | 4/2011 | Barrett | G03F 1/42 430/5 |
| 8,423,926 | B2 * | 4/2013 | Koshiba | G03F 1/22 716/50 |
| 8,718,353 | B2 * | 5/2014 | Li | G06T 7/001 382/141 |
| 2005/0226492 | A1 * | 10/2005 | Ho | G03F 1/84 382/144 |
| 2010/0233594 | A1 * | 9/2010 | Zhang | G03F 1/84 430/5 |
| 2010/0237256 | A1 | 9/2010 | Yoshitake | |

* cited by examiner

*Primary Examiner* — John P Dulka
(74) *Attorney, Agent, or Firm* — Patterson & Sheridan, LLP.

(57) ABSTRACT

An exposure mask fabrication method includes measuring and storing defect position data, for each EUV exposure mask blank, that indicates the position of at least one defect in each of plural EUV exposure mask blanks, inputting pattern data defining a figure pattern to be written, searching, when the figure pattern is written, in plural EUV exposure mask blanks, an EUV exposure mask blank where the figure pattern can be arranged such that the number of defects not located in a light shielding region is less than or equal to a threshold value, based on the arrangement position of the figure pattern in the pattern data, using the defect position data for each EUV exposure mask blank, and writing the figure pattern on a searched EUV exposure mask blank such that the number of defects not located in the light shielding region is less than or equal to the threshold value.

12 Claims, 16 Drawing Sheets

```
Mask Blank Number 1  The Number of Defects=3
   Defect Number 1_1, x Position 1_1, y Position 1_1, Size 1_1
   Defect Number 1_2, x Position 1_2, y Position 1_2, Size 1_2
   Defect Number 1_3, x Position 1_3, y Position 1_3, Size 1_3

Mask Blank Number 2  The Number of Defects=2
   Defect Number 2_1, x Position 2_1, y Position 2_1, Size 2_1
   Defect Number 2_2, x Position 2_2, y Position 2_2, Size 2_2
```

LSI Pattern

In Case of Mask Blank 1

(After Shifting)

LSI Pattern

Mark for Alignment

In Case of Mask Blank 2

(After Shifting)

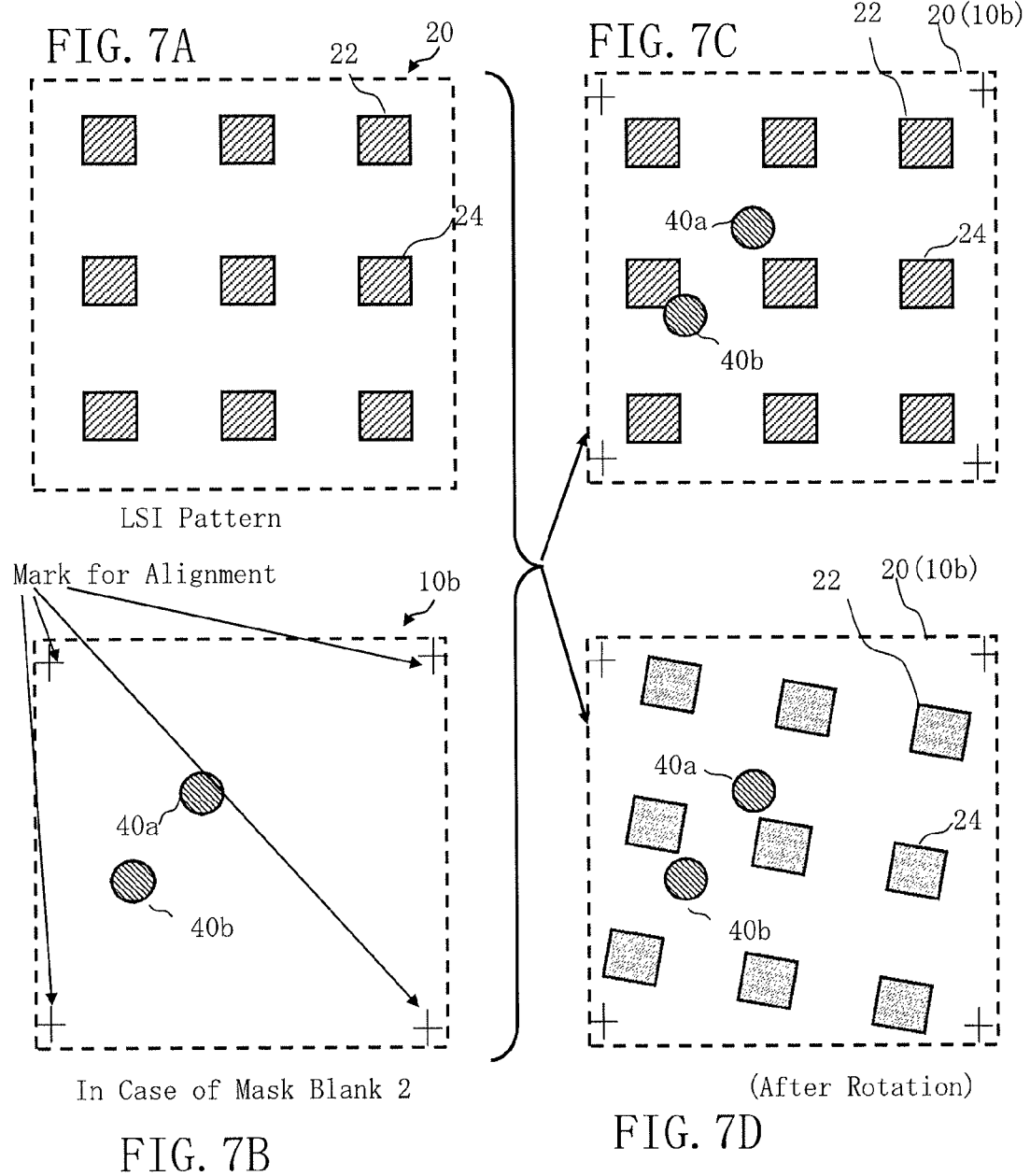

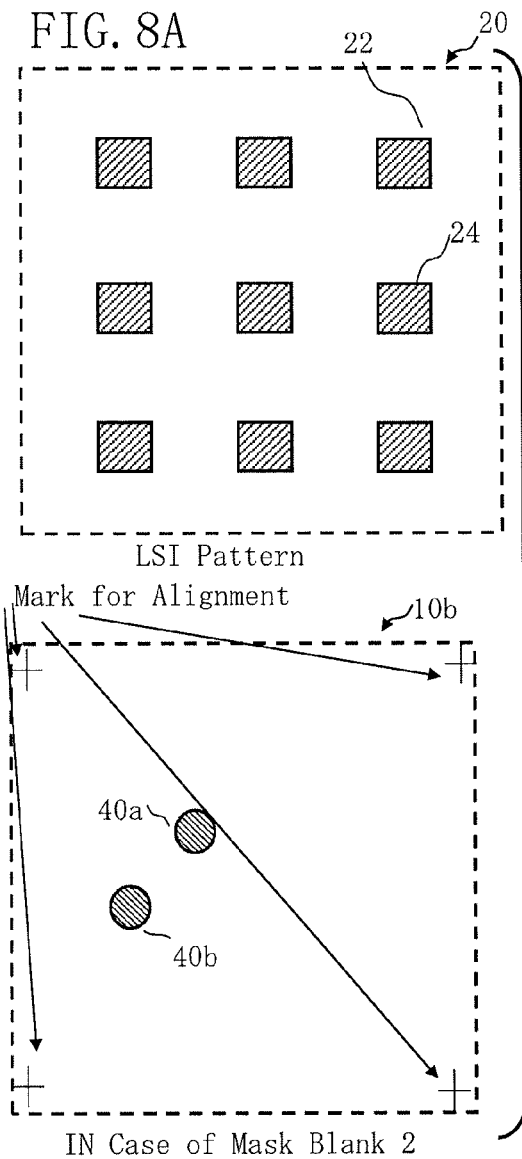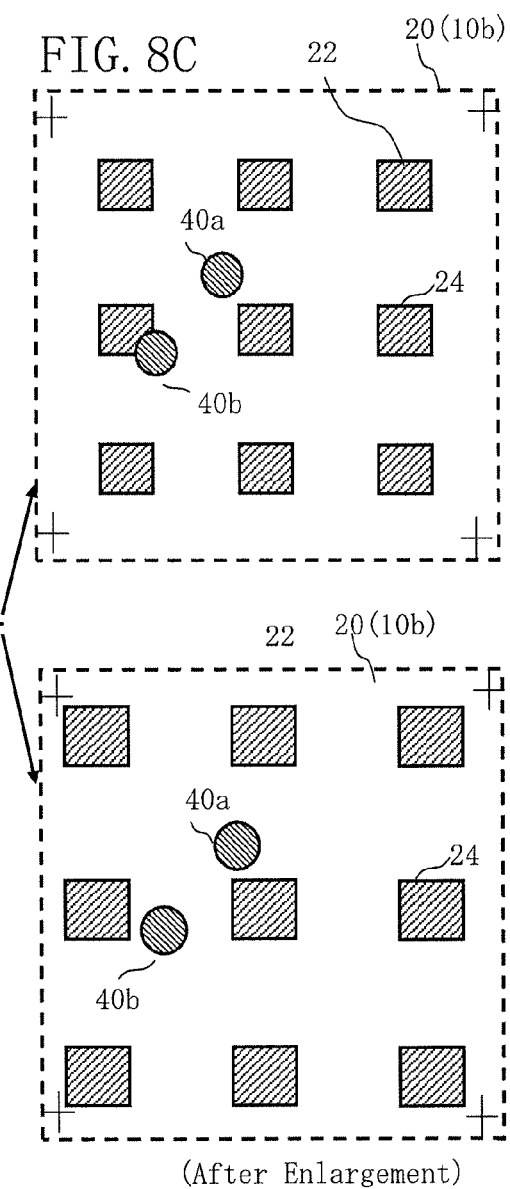
FIG. 8A  LSI Pattern
FIG. 8B  Mark for Alignment / IN Case of Mask Blank 2
FIG. 8C
FIG. 8D  (After Enlargement)

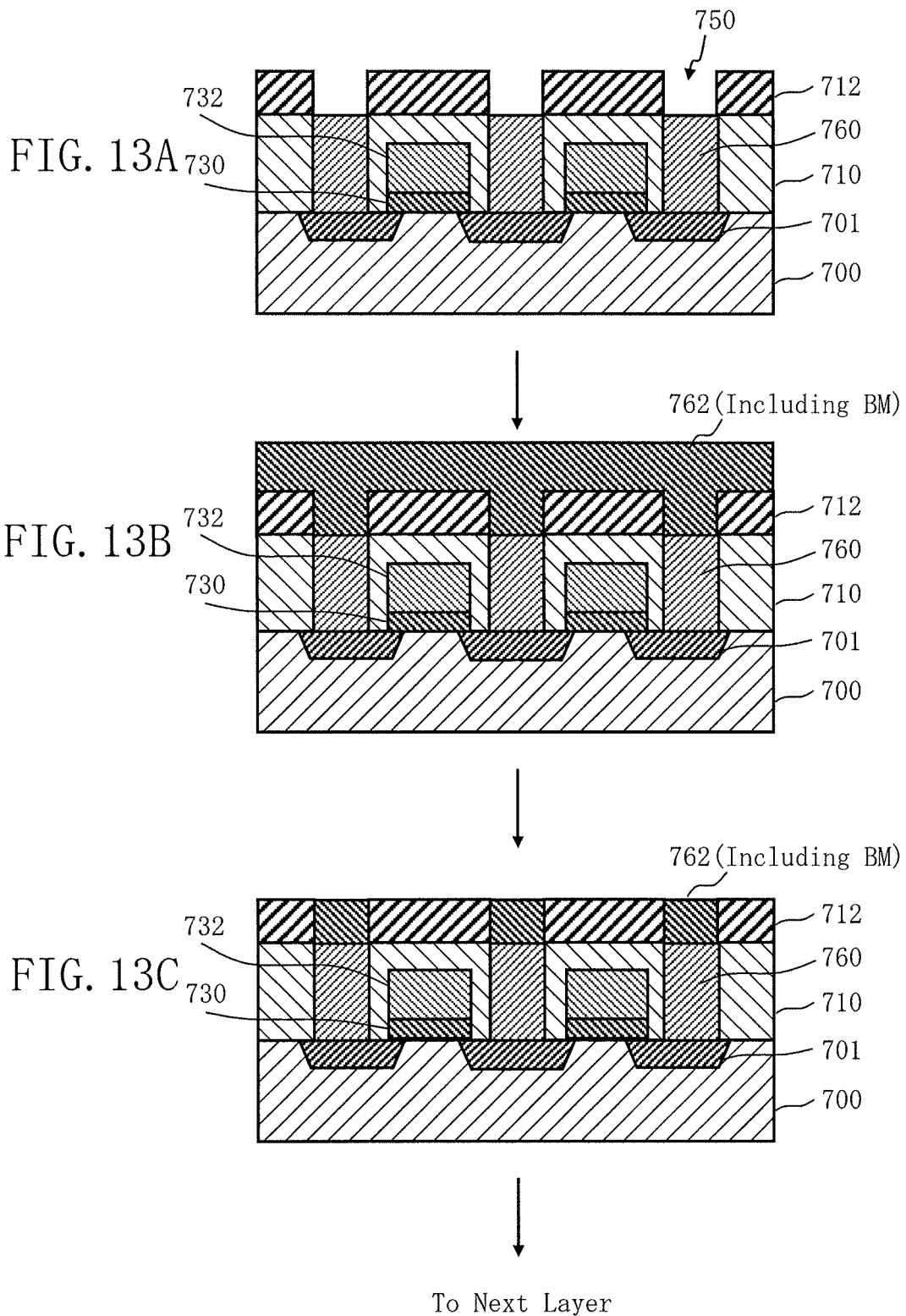

To Next Layer

EXPOSURE MASK FABRICATION METHOD, EXPOSURE MASK FABRICATION SYSTEM, AND SEMICONDUCTOR DEVICE FABRICATION METHOD

CROSS-REFERENCE TO RELATED APPLICATION

This application is based upon and claims the benefit of priority from the prior Japanese Patent Application No. 2014-006241 filed on Jan. 16, 2014 in Japan, the entire contents of which are incorporated herein by reference.

BACKGROUND OF THE INVENTION

1. Field of the Invention

The present invention relates to an exposure mask fabrication method, an exposure mask fabrication system, and a semiconductor device fabrication method. More specifically, the present invention relates to, for example, an apparatus and method for writing a pattern onto a mask substrate with electron beams in order to fabricate a mask to be used for an EUV (Extreme Ultra Violet) exposure.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

FIG. 16 is a conceptual diagram explaining operations of a variable shaping type electron beam writing or "drawing" apparatus. The variable shaping electron beam (EB) writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the x direction) during the writing. In other words, a quadrangular shape that can pass through both the aperture 411 and the variable shape aperture 421 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

With recent miniaturization of semiconductor devices, further shortening the wavelength itself of exposure light is considered. Regarding developing new microlithography technique, light of 157 nm has been given up due to lack of lens material used for image reducing or transferring. For this reason, extreme ultraviolet (EUV) light with a wavelength of 13.4 nm is thought to be the most promising at present. Since the EUV light, whose wavelength is classified into the soft X-ray region, is transmitted and/or absorbed by many materials, it cannot form a projection optical system any longer. Therefore, a catoptric system is proposed for the exposure method using the EUV light. Thus, in the EUV lithography, a catoptric system composed of a multilayer mirror (mirror of multilayer film) which reflects EUV light is used. An EUV exposure mask intervenes as a part of the optical system. Therefore, a reflection-type mask wherein a multilayer film is formed on the substrate is employed. The multilayer film formed by alternately layering molybdenum (Mo) and silicon (Si) is used.

Then, if the regularity of each layer thickness of these laminated layers breaks down, the phase of reflected light will be shifted. As a result, a phase defect will be exposed on the wafer. Thus, it is desirable that there is no defect on the surface of the multilayer substrate. Moreover, it is desirable to prevent particulate contamination which may generate a defect from being included in the multilayer film. Furthermore, since the EUV mask is a part of the catoptric system, irregularity of the mask surface will generate a shift of the phase of reflected light on the reflection surface. Consequently, there will be generated a positional deviation or size irregularity of a pattern to be transferred or printed onto a wafer at the time of exposure. Due to the reason described above, the substrate itself is required to have highly precise flatness.

However, it is difficult to completely reduce the defect rate of a substrate to zero, and if selecting only a substrate that has no defect or satisfies specification after inspecting all fabricated masks, it will make the substrate very expensive.

Then, in order to avoid transferring or printing a defect of a mask in exposure processing, there is disclosed a technique in which a phase defect on a multilayer mask is prevented from being transferred or printed because, by shifting a pattern, the phase defect is included in the region of an absorber pattern (refer to, e.g., Japanese Patent Application Laid-open (JP-A) No. 2001-033941).

It is necessary to previously specify the position of a defect by an inspection apparatus which inspects particulate contamination of a mask blank (substrate), and to reflect the specified position to pattern data such that the pattern layout is shifted according to the specified position of the defect. However, there has been a problem that, in some cases, it is difficult to hide a phase defect in the region of an absorber pattern no matter how much the pattern layout is shifted. Thereby, in such a case, it becomes difficult to perform writing processing, and, simultaneously, difficult to fabricate an EUV exposure mask.

Accordingly, it becomes difficult to manufacture semiconductor devices which are fabricated by a pattern transferring or printing operation with an EUV exposure mask. Conventionally, no sufficient method for solving these problems has been established.

BRIEF SUMMARY OF THE INVENTION

According to one aspect of the present invention, an exposure mask fabrication method includes measuring and storing defect position data, for each EUV (Extreme Ultra Violet) exposure mask blank, that indicates a position of at least one or more defects generated in each of a plurality of EUV exposure mask blanks, inputting pattern data which defines a figure pattern to be written, searching, when the figure pattern is written, in the plurality of EUV exposure mask blanks, an EUV exposure mask blank on which the figure pattern can be arranged such that a number of defects not being located in a light shielding region is less than or equal to a threshold value, based on an arrangement position of the figure pattern defined in the pattern data, using the defect position data for the each EUV exposure mask blank, and writing the figure pattern on a searched EUV exposure mask blank such that a number of defects not being located in the light shielding region is less than or equal to the threshold value, using a charged particle beam.

According to another aspect of the present invention, an exposure mask fabrication system includes a first storage unit configured to store defect position data, for each EUV (Extreme Ultra Violet) exposure mask blank, that indicates a position of at least one or more defects generated in each of a plurality of EUV exposure mask blanks, a second storage unit configured to input and store pattern data which defines a figure pattern to be written, a search unit configured, in writing the figure pattern, to search, in the plurality of EUV exposure mask blanks, an EUV exposure mask blank on which the figure pattern can be arranged such that a number of defects not being located in a light shielding region is less than or equal to a threshold value, based on an arrangement position of the figure pattern defined in the pattern data, and a writing unit configured to write the figure pattern on a searched EUV exposure mask blank such that a number of defects not being located in the light shielding region is less than or equal to the threshold value, using a charged particle beam.

Further, according to another aspect of the present invention, a semiconductor device fabrication method includes measuring and storing defect position data, for each EUV (Extreme Ultra Violet) exposure mask blank, that indicates a position of at least one or more defects generated in each of a plurality of EUV exposure mask blanks, inputting pattern data which defines a figure pattern to be written, searching, when the figure pattern is written, in the plurality of EUV exposure mask blanks, an EUV exposure mask blank on which the figure pattern can be arranged such that a number of defects not being located in a light shielding region is less than or equal to a threshold value, based on an arrangement position of the figure pattern defined in the pattern data, using the defect position data for the each EUV exposure mask blank, writing the figure pattern on a searched EUV exposure mask blank such that a number of defects not being located in the light shielding region is less than or equal to the threshold value, using a charged particle beam, and transferring the figure pattern onto a semiconductor substrate, using the EUV exposure mask on which the figure pattern has been written.

BRIEF DESCRIPTION OF THE DRAWINGS

FIGS. 7A to 7D show other examples of a relation between a defect pattern and an arrangement layout of a figure pattern on a mask blank according to the first embodiment;

FIGS. 8A to 8D show other examples of a relation between a defect pattern and an arrangement layout of a figure pattern on a mask blank according to the first embodiment;

FIGS. 13A to 13C are other sectional views showing a part of a fabrication method of a semiconductor device according to the first embodiment;

DETAILED DESCRIPTION OF THE INVENTION

In the following embodiments, there will be described a system and method that enables to fabricate an EUV exposure mask in which defects are include in the region of an absorber pattern.

Furthermore, in the following embodiments, there will be described a configuration in which an electron beam is used as an example of a charged particle beam. The charged particle beam is not limited to the electron beam, and other charged particle beam such as an ion beam may also be used.

First Embodiment

Figure 1:
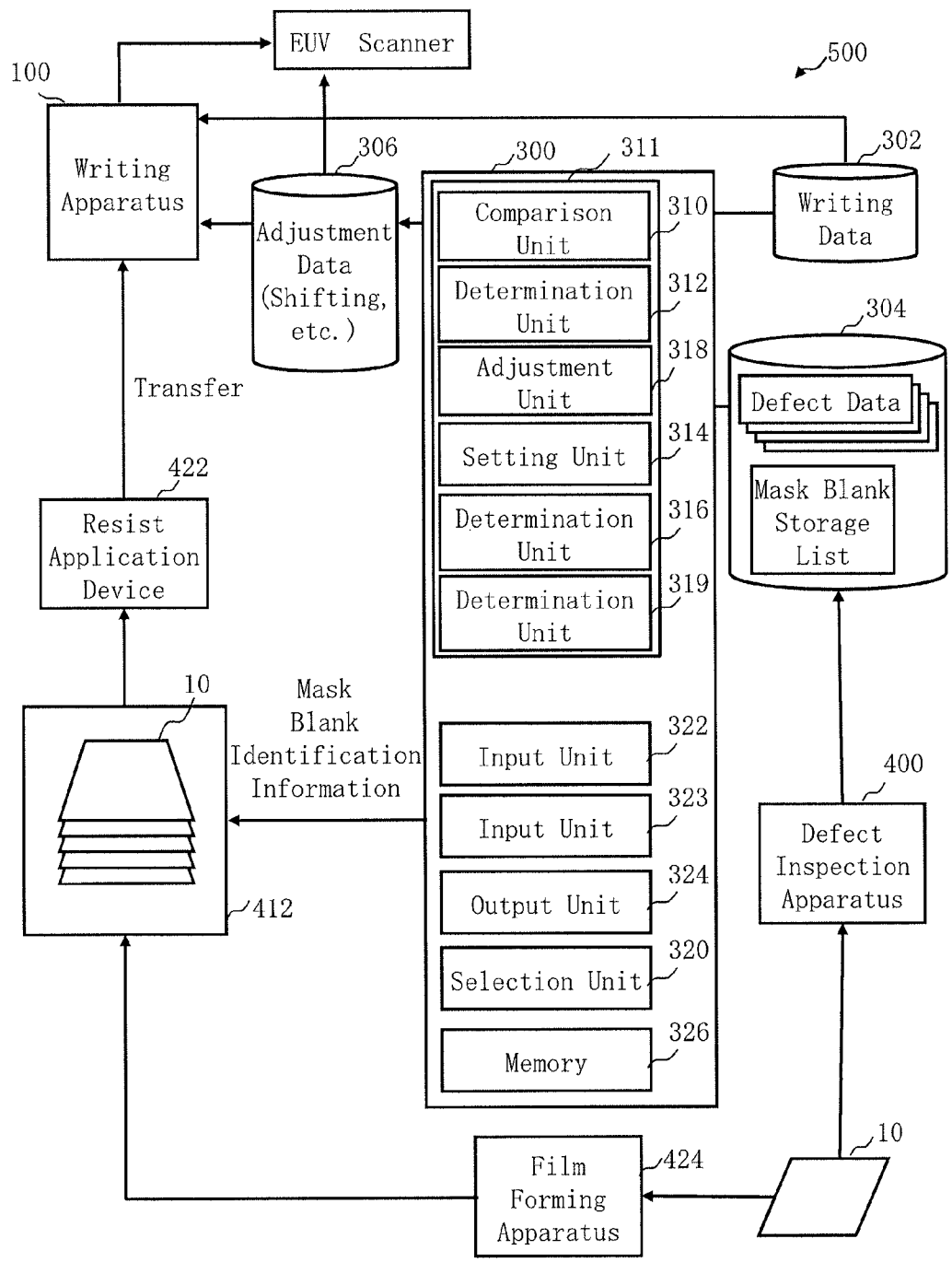
FIG. 1 is a schematic diagram showing a configuration of a fabrication system of an EUV exposure mask according to a first embodiment.

FIG. 1 is a schematic diagram showing a configuration of a fabrication system of an EUV exposure mask according to the first embodiment. In FIG. 1, a fabrication system 500 of the EUV exposure mask includes a writing apparatus 100, a management apparatus 300, and a mask blank storage device 412. The management apparatus 300 includes storage devices 302, 304, and 306, such as magnetic disk drives. The writing apparatus 100, the management apparatus 300, the mask blank storage device 412, and the storage devices 302, 304, and 306 are connected with each other by bus (not shown). Writing data which defines a plurality of figure patterns is stored in the storage device 302. It is preferable to use the same writing data as what is input by the writing apparatus 100. Alternatively, design data (CAD data), etc. before being converted into writing data may be used.

In the management apparatus 300, there are arranged input units 322 and 323, a search unit 311, a selection unit 320, an output unit 324, and a memory 326. These functions may be configured by hardware such as an electric circuit, or by software such as a program causing a computer to implement these functions. Alternatively, they may be configured by a combination of hardware and software. Data which is input and output to/from the input units 322 and 323, the search unit 311, the selection unit 320, and the output unit 324 and data being calculated are stored in the memory 326 each time.

In the search unit 311, there are arranged a setting unit 314, a comparison unit 310, determination units 312, 316 and 319, and an adjustment unit 318 (adjustment being such as to shift, rotate, or reduce). These functions may be configured by hardware such as an electric circuit, or by software such as a program causing a computer to implement these functions. Alternatively, they may be configured by a combination of hardware and software. Data which is input and output to/from the setting unit 314, the comparison unit 310, the determination units 312, 316, and 319, and the adjustment unit 318 and data being calculated are stored in the memory 326 each time.

FIG. 1 shows a configuration necessary for explaining the first embodiment. Other configuration elements generally necessary for a fabrication system of an EUV exposure mask may also be included. For example, input devices, such as a mouse and a keyboard, a monitoring device, an external interface circuit, etc. may be connected to the writing apparatus 100, the management apparatus 300, and the mask blank storage device 412.

Figure 2A:
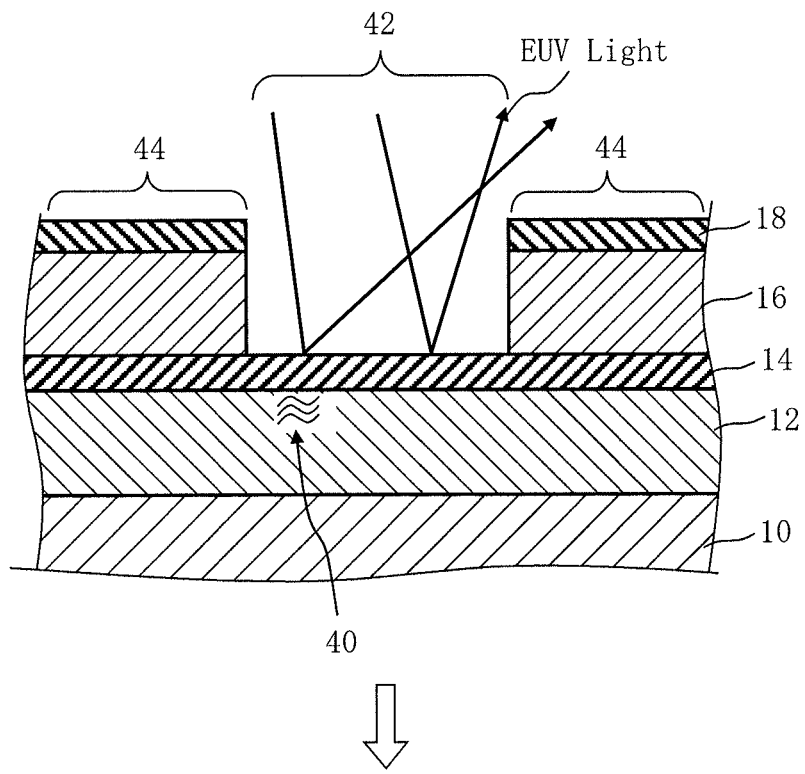
FIGS. 2A and 2B are conceptual diagrams showing examples of sections of an EUV mask according to the first embodiment.
Figure 2B:
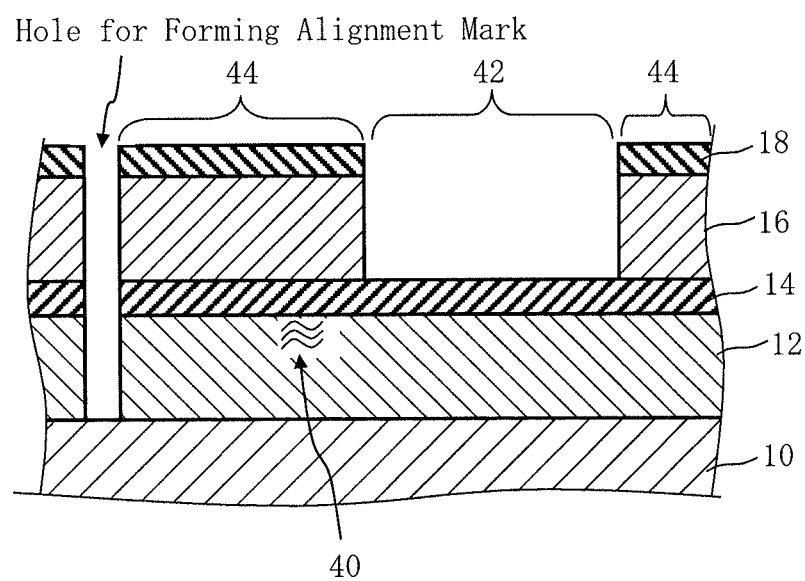

FIGS. 2A and 2B are conceptual diagrams showing examples of sections of an EUV mask according to the first embodiment. The EUV mask is formed in a manner such that a multilayer film 12 is applied all over the surface of a substrate 10. The multilayer film 12 is composed of, for example, forty laminated layers of alternately laminated molybdenum (Mo) of 2.9 nm thick and silicon (Si) of 4.1 nm thick. As the substrate 10, a glass substrate is used, for example. A cap film 14, such as ruthenium (Ru), is applied on the whole surface of the multilayer film 12. The cap film 14 is exposed at the region where EUV light is reflected. By contrast, at the region where EUV light is not reflected, an absorber film 16 which absorbs EUV light and an antireflection film 18 are formed in order on the cap film 14. As shown in FIG. 2A, if a defect 40 of the multilayer film 12 exists in a region 42 where the absorber film 16 does not exist, the phase of a reflected EUV light is shifted. As a result, when a pattern is transferred or printed onto a semiconductor wafer by using this EUV mask, the position of the pattern will be deviated or measurement will be degraded. Thus, according to the first embodiment, as shown in FIG. 2B, writing is performed using data in which the pattern layout has been shifted from the position shown in FIG. 2A so that the position of the defect 40 may be in a region 44, where the absorber film 16 exists, after patterning. Here, the amount of shifting is determined on the basis of an alignment mark which has previously been formed on the blank mask. To explain specifically, patterning of the substrate is performed as follows: a pattern is written by the writing apparatus 100 on the substrate being an EUV mask blank applied with a resist film, the resist is developed, the antireflection film 18 and the absorber film 16 are etched by using the resist pattern, as a mask, which is formed of the resist film remaining after the development, and the remaining resist film is removed by performing ashing. Through such patterning, the EUV mask is fabricated. Then, after the patterning, when writing is performed by the writing apparatus 100, the pattern layout is shifted such that the position of the defect 40 is in the region 44 where the absorber film 16 exists. In order to shift the pattern layout, first, it is necessary to specify the position of a defect. Therefore, a phase defect inspection of the substrate 10 should be performed by a defect inspection apparatus 400 before writing.

In the case of a positive resist material being used, the region 44 (light shielding region) where the absorber film 16 remains after patterning is a non-irradiation region (non-writing region) of an electron beam 200, and the region 42 where the absorber film 16 does not remain is an irradiation region (writing region) of the electron beam 200. In the case of a negative resist material being used, the region 44 (light shielding region) where the absorber film 16 remains after patterning is an irradiation region (writing region) of the electron beam 200, and the region 42 where the absorber film 16 does not remain is a non-irradiation region (non-writing region) of the electron beam 200. In other words, the region where a resist film remains after developing resist is the region 44 where the absorber film 16 remains, and the region where a resist film does not remain is the region 42 where the absorber film 16 does not remain. Moreover, a conductive film, such as chromium nitride (CrN), is formed on the backside of the glass substrate 10.

In the defect inspection apparatus 400, inspection is performed to inspect whether a phase defect exists or not and where a phase defect is positioned, with respect to the state in which the multilayer film 12 is formed all over the surface of the glass substrate 10, namely, with respect to the substrate 10 on which the absorber film 16 and the antireflection film 18 have not been formed yet. In addition, it is acceptable that the cap film 14 has been formed. The defect inspection apparatus 400 needs to previously inspect (measure), with respect to a plurality of substrates 10, whether a phase defect exists or not and where the phase defect is positioned. As to the number N of a plurality of substrates 10 (EUV exposure mask blanks) to be inspected beforehand, when the average defect number on a mask blank is supposed to be B, while at least one predetermined pattern (for example, a typical pattern, namely, a standard pattern) to be transferred or printed by the EUV transfer apparatus (scanner) should be previously assumed, it is preferable that, as shown in the following equation (1), the number N is greater than or equal to the inverse of the value obtained by raising an area ratio A (an amount obtained by dividing the area of a light shielding region by the entire area) of the light shielding region (absorber film region) corresponding to a figure pattern in the standard pattern to the B-th power, B being the average number of defects. This is because, when the probability that one defect is hidden under an absorber is A and there are B defects, the probability that all the defects can be hidden is A exponentiated to the B-th power. Then, if the inverse of this value "A raised to the B-th power" is calculated, the calculated value is an average value of the number of all the inspection masks when one mask in which all of defects are hidden can be found in all the inspections masks. Therefore, what is substantially necessary is to prepare blanks whose number is greater than or equal to the average value. As a typical pattern, it is preferable to use a pattern which is generally largely fabricated. For example, it is more preferable to use a pattern which is fabricated most largely. For example, if mask blanks whose number is greater than or equal to the average value have been previously inspected, since the probability that all defects are hidden under the absorber film 16 is $A^B$, in the case where the light shielding region corresponding to a figure pattern is 90% (A=0.9) and an average number of defects of mask blanks is 30 (B=30), probability K that all the defects are hidden under the absorber film 16 is 4.2% (K=0.042). Therefore, it is necessary to prepare mask blanks whose number is at least the inverse of the probability K in order to acquire a mask blank in which all defects can be hidden under the absorber film. Thus, it is preferable to previously perform a phase defect inspection of the substrates 10 whose number is greater than or equal to N by the phase defect inspection apparatus 400.

The obtained defect data (data on defects) of each mask blank is stored in the storage device 304.

$$N \geq 1/A^B \qquad (1)$$

Figures 3A, 3B:
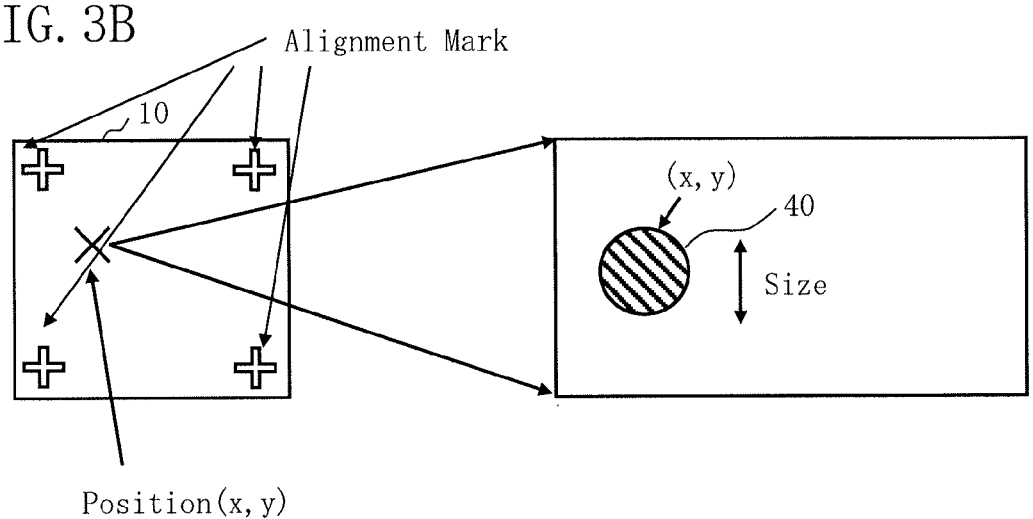
FIGS. 3A and 3B show an example of data on defects according to the first embodiment.

FIGS. 3A and 3B show an example of data on defects according to the first embodiment. As shown in FIG. 3B, in many cases, there is the defect 40 in the substrate 10 (EUV mask blank). Therefore, when performing an inspection, the defect inspection apparatus 400 measures the position coordinates (x,y) and the size of the defect 40. The position of a defect is specified on the basis of the position of an alignment mark formed in advance on the blank mask. The result of the measurement is output as defect data shown in FIG. 3A. Defect data defines, for each mask blank, a mask blank number, the number of defects, a defect number, an x coordinate, a y coordinate, and a size, for example, as shown in FIG. 3A. A defect number, an x coordinate, a y coordinate, and a size are repeatedly defined according to the number of defects. The defect data is transmitted from the defect inspection apparatus 400 and stored in the storage device 304 which is connected to the management apparatus 300.

As for each substrate 10 for which an inspection of a phase defect has been finished, the absorber film 16 and the antireflection film 18 are formed on the multilayer film 12 or the cap film 14 by a film forming apparatus 424. The absorber film 16 and the antireflection film 18 are formed all over the surface of the substrate. Each substrate 10 on which the absorber film 16 and the antireflection film 18 have been formed is conveyed, as an EUV exposure mask blank, to the mask blank storage device 412.

In the mask blank storage device 412, there are stored a plurality of EUV exposure mask blanks (substrates 10) on each of which nothing has yet been written. Specifically, in the mask blank storage device 412, there are stored N mask blanks whose number N is greater than or equal to the inverse of the value obtained by raising an area ratio A of the light shielding region (absorber film region) of a typical LSI pattern to be transferred or printed by an EUV scanner to the B-th power, B being the average number of defects. The area ratio A of the light shielding region (absorber film region) corresponding to a figure pattern may be calculated in advance based on writing data. Alternatively, mask blanks whose number is sufficiently larger than the number N may be stored. At this stage, it is better that the mask blank is not applied with resist. It is desirable to apply resist after determining which mask blank is to be used for writing, because one (or two or three) mask blank to be used for writing will be selected from a lot of mask blanks. However, it is not limited thereto, and resist may be applied on each of a plurality of EUV exposure mask blanks. The mask blank storage device 412 outputs identification information (for example, a mask blank number) for identifying a plurality of stored mask blanks to the management apparatus 300. For example, it is preferable to generate a mask blank storage list in which identification information for identifying these plurality of mask blanks is defined, and to output the list to the management apparatus 300. This identification information should be defined by data coincident with or corresponding to another identification information which is for identifying a plurality of mask blanks defined in defect data. The management apparatus 300 stores the mask blank storage list, in which identification information for identifying a plurality of mask blanks is defined, in the storage device 304.

Figure 4:
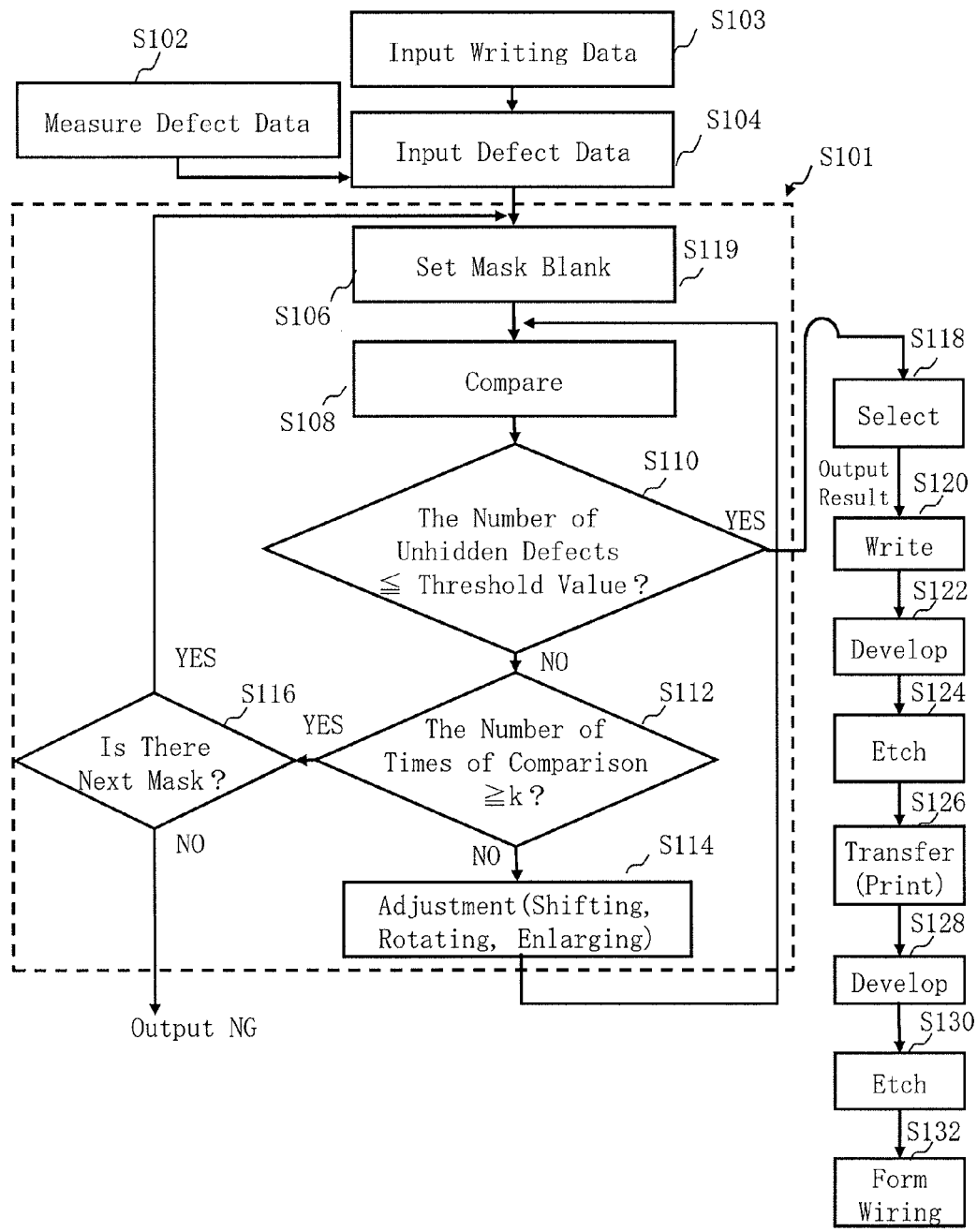
FIG. 4 is a flowchart showing main steps of a fabrication method of a semiconductor device according to the first embodiment.

FIG. 4 is a flowchart showing main steps of a fabrication method of a semiconductor device according to the first embodiment. In FIG. 4, the semiconductor device fabrication method of the first embodiment executes a series of steps: an EUV exposure mask blank acquisition step (S101), a writing step (S120), a development step (S122), an etching step (S124), a transferring (printing) step (S126), a development step (S128), an etching step (S130), and a wiring forming step (S132).

In these steps, a series of steps of the EUV exposure mask blank acquisition step (S101), the writing step (S120), the development step (S122), and the etching step (S124) is executed as a fabrication method of an exposure mask.

In the EUV exposure mask blank acquisition step (S101), a series of steps of a defect data measurement step (S102), an input step (S103), an input step (S104), a search step (S119), and a selection step (S118) is executed as an internal step. In the search step (S119), a series of steps of a setting step (S106), a comparison step (S108), a determination step (S110), a determination step (S112), a shift processing step (S114), and a determination step (S116) is executed as internal an step.

In the defect data measurement step (S102), as described above, defect position data indicating the position of at least one or more defects generated in each of a plurality of EUV exposure mask blanks is measured for each EUV exposure mask blank by using the defect inspection apparatus 400 and stored in the storage device 304 (first storage unit).

In the input step (S103), the input unit 323 inputs pattern data defining a figure pattern to be written. Specifically, writing data stored in the storage device 302 (second storage unit) is input.

In the input step (S104), the input unit 322 inputs defect position data (an example of defect data), for each EUV exposure mask blank, indicating the position of at least one or more defects generated in each of a plurality of EUV exposure mask blanks. In this case, defect data defining a defect size, as well as a defect position, stored in the storage device 304 is input. If a defect size is approximately fixed or its estimated size is preset, it is enough that only defect position data indicating the position of a defect is defined as defect data. Thus, just to input the defect position data is needed in such a case.

Next, in the search step (S119), the search unit 311 searches, in a plurality of EUV exposure mask blanks, an EUV exposure mask blank on which a figure pattern can be arranged such that the number of defects not being located in the light shielding region is less than or equal to a threshold value when the figure pattern is written, based on an arrangement position of the figure pattern defined in pattern data, using defect position data for each of the EUV exposure mask blank.

Specifically, for each EUV exposure mask blank, by comparing the arrangement position of a figure pattern defined in pattern data with the position of a defect defined in the defect position data for the EUV exposure mask blank concerned, the search unit 311 searches, in a plurality of EUV exposure mask blanks, an EUV exposure mask blank on which a figure pattern can be arranged such that the number of defects not being located in the light shielding region is less than or equal to a threshold value when the figure pattern is written. More specifically, it is performed as follows:

In the mask blank setting step (S106), with reference to the mask blank storage list in the storage device 304, the setting unit 314 selects one mask blank from a plurality of mask blanks defined in the list and sets it. For example, one mask blank at the top of a plurality of mask blanks defined in the list is selected and set.

In the comparison step (S108), the comparison unit 310 extracts positions and sizes of all the defects in a selected mask blank, and overlaps respective defect patterns of the extracted positions and sizes with arrangement layout of a figure pattern defined in pattern data in order to compare the defect position with the arrangement position of the figure pattern.

In the determination step (S110), the determination unit 312 determines whether the number of defects that cannot be hidden under the light shielding region of a figure pattern (namely, the number of defects existing outside the light shielding region) is less than or equal to a preset threshold value of the number of defects. As a result of the determination, when the number of defects that cannot be hidden under the light shielding region is less than or equal to the threshold value, it goes to the selection step (S118). When the number of defects that cannot be hidden under the light shielding region is not less than or equal to the threshold value, it goes to the determination step (S112).

In the determination step (S112), the determination unit 316 determines whether the number of times of comparison, namely the number of times of comparing a defect pattern with the arrangement layout of the figure pattern, is less than or equal to a preset threshold value k of the number of times of comparison. As a result of the determination, when the number of times of comparison is less than or equal to the threshold value of the number of times of comparison, it goes to the determination step (S116). When the number of times of comparison is not less than or equal to the threshold value of the number of times of comparison, it goes to the adjustment processing step (S114).

In the adjustment processing step (S114), such as shifting, rotating, and enlarging, when the number of defects not being located in the light shielding region is not less than or equal to a threshold value at the current arrangement position of a figure pattern, the adjustment unit 318 shifts the arrangement position of the figure pattern. Specifically, it operates as follows: The whole of all defect patterns and the whole arrangement layout of a figure pattern of a selected mask blank are relatively adjusted by moving (shifting), rotating, enlarging, etc. For example, shifting is performed in the combination of directions of x, y, and rotation. After shifting, it returns to the comparison step (S108). Until the number of defects that cannot be hidden under the light shielding region becomes less than or equal to a threshold value in the determination step (S110), or until the number of times of comparison becomes less than or equal to a threshold value of the number of times of comparison in the determination step (S112), each of the steps from the comparison step (S108) to the adjustment processing step (S114), such as shifting, rotating, and enlarging is repeated.

Figure 5A:
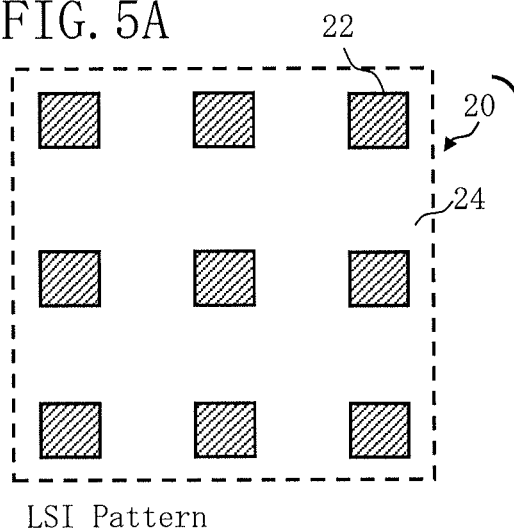
FIGS. 5A to 5D show examples of a relation between a defect pattern and an arrangement layout of a figure pattern on a mask blank according to the first embodiment.
Figure 5B:
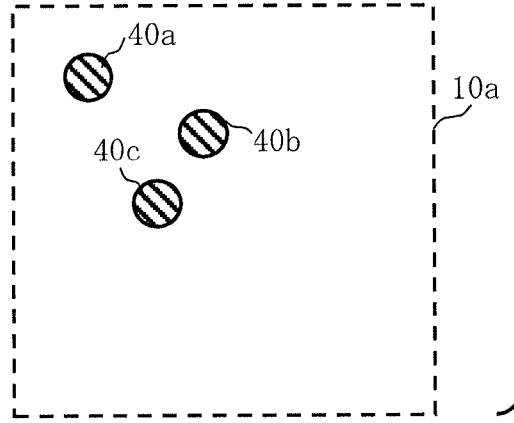
Figure 5C:
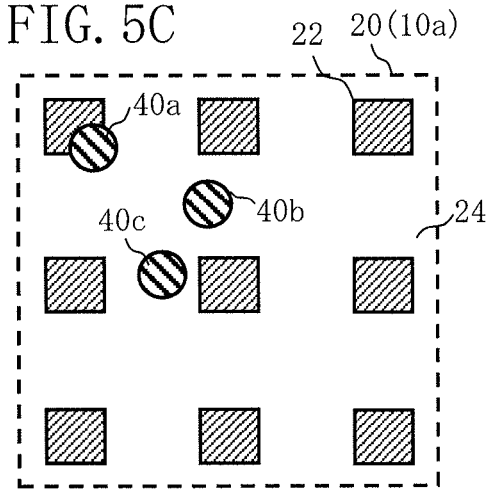

FIGS. 5A to 5D show examples of a relation between a defect pattern and an arrangement layout of a figure pattern on a mask blank according to the first embodiment. An example of the arrangement layout of a figure pattern is shown in FIG. 5A. In the example of FIG. 5A, a plurality of quadrangular patterns 22 are arranged in a chip 20. When patterns in the chip 20 are written, the regions of a plurality of quadrangular patterns 22 are regions where the absorber film 16 is removed and the cap film 14 (the multilayer film 12) is exposed. Thus, a remaining region 24 is a region where the light shielding region, namely the absorber film 16, remains. FIG. 5B shows an example of the layout of a defect pattern of a selected mask blank 1 (substrate 10a). In the example of FIG. 5B, there are three defects 40a, 40b, and 40c, for example, in the region of the chip 20. FIG. 5C shows an example where the arrangement layout of a figure pattern overlaps with the layout of a defect pattern in the state in which the positional relation has not been shifted relatively. In the example of FIG. 5C, the defect 40a of the three defects 40a, 40b, and 40c is not hidden in the region 24 being the light shielding region.

Figure 5D:
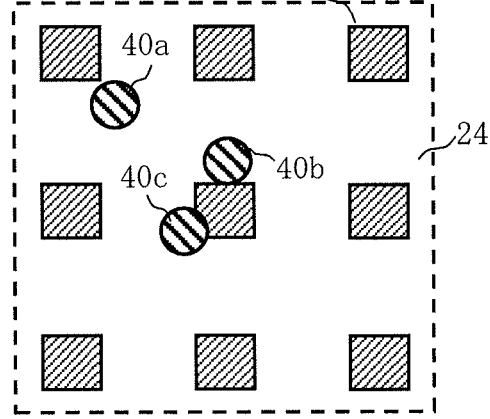

With respect to the adjustment processing step (S114), such as shifting, rotating, and enlarging, FIG. 5D shows the case where, even if the adjustment is performed repeatedly, for example, the defect 40c of the three defects 40a, 40b, and 40c cannot be hidden in the region 24 being the light shielding region by the shift adjustment (adjustment of position). Thus, there exists a mask blank in which a defect cannot be hidden however much adjustment is performed. By repeating each step from the comparison step (S108) to the adjustment processing steps (S114), such as shifting, rotating, and enlarging, it can be known which mask blank is the one in which a defect cannot be hidden even if shifting is performed. It is understood that this mask blank (substrate 10a) is difficult to use for writing. Here, there is shown the case where the threshold value of the number of defects in the determination step (S110) is set to 0, for example, that is the case where all the defects are hidden.

In the determination step (S116), the determination unit 319 determines whether a next mask blank (mask blank which has not been compared yet) exists in a plurality of mask blanks defined in the mask blank storage list. As a result of the determination, if a next mask blank does not exist, the output unit 324 outputs "NG" indicating it is difficult for all of a plurality of mask blanks defined in the mask blank storage list to write a figure pattern of the pattern data concerned. When a next mask blank exists, it returns to the mask blank setting step (S106). Then, each step from the mask blank setting step (S106) to the determination step (S116) is repeated until the number of defects that cannot be hidden under the light shielding region becomes less than or equal to a threshold value in the determination step (S110) or until the number of mask blanks that have not been compared yet in a plurality of mask blanks defined in the mask blank storage list becomes 0 (zero) in the determination step (S116).

Figure 6A:
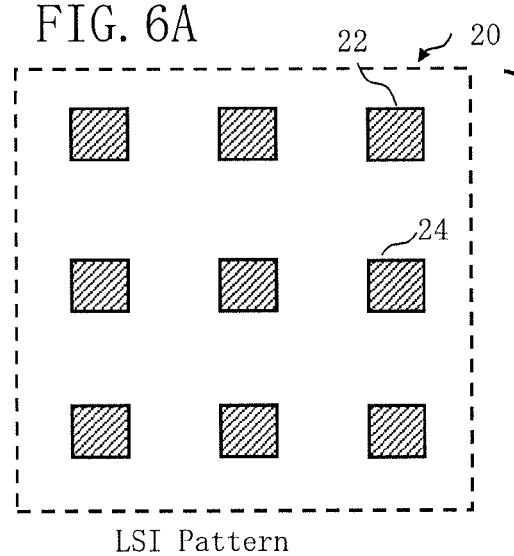
FIGS. 6A to 6D show other examples of a relation between a defect pattern and an arrangement layout of a figure pattern on a mask blank according to the first embodiment.
Figure 6B:
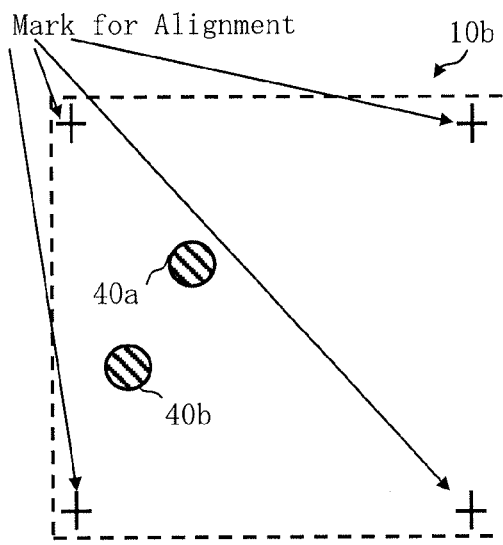
Figure 6C:
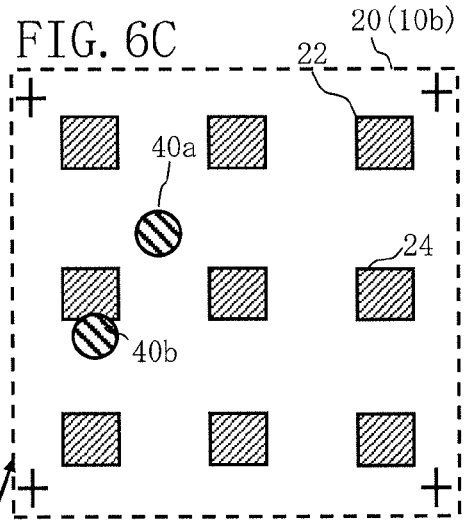
Figure 6D:
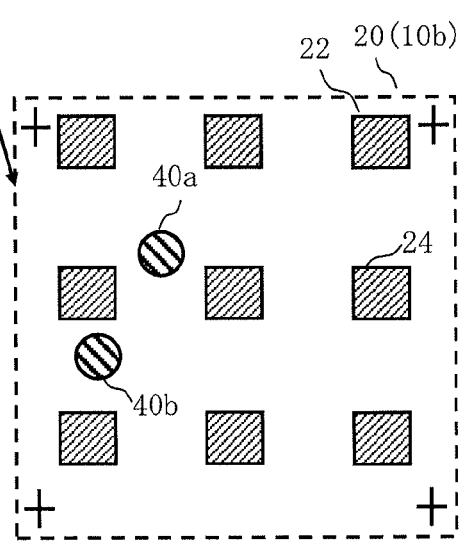

FIGS. 6A to 8C show other examples of a relation between a defect pattern of a mask blank and an arrangement layout of a figure pattern according to the first embodiment. FIGS. 6A, 7A, and 8A show examples of the arrangement layout of a figure pattern similar to that of FIG. 5A. FIGS. 6B, 7B, and 8B show examples of the layout of a defect pattern of a selected mask blank 2 (substrate 10b). In the examples of FIGS. 6B, 7B, and 8B, there are, for example, two defects 40a and 40b in the region of the chip 20. FIGS. 6C, 7C, and 8C show examples of the case where the arrangement layout of a figure pattern overlaps with the layout of a defect pattern in the state in which the positional relation has not been shifted relatively. In the examples of FIGS. 6C, 7C, and 8C, one defect 40a of the two defects 40a and 40b is hidden in the region 24 being the light shielding region, and the other defect 40b is not hidden in the region 24 being the light shielding region. However, in the adjustment processing steps (S114), such as shifting, rotating, and enlarging, as shown in the example of FIG. 6D, both the defects 40a and 40b can be hidden in the region 24 being the light shielding region by performing shifting, for example. Searching is performed to find a mask blank where defects can be hidden by being shifted. By repeating each step from the comparison step (S108) to the shift processing step (S114), it is possible to search for a mask blank in which defects can be hidden in the position relation not having been changed, or in the position relation having been shifted. This mask blank (substrate 10b) can be used for writing.

The examples of hiding a defect by shift adjustment have been described, and further, there is also a case where a defect can be hidden by rotation or enlargement, which is shown in FIGS. 7D and 8D. The examples of FIGS. 7D and 8D show a case where rotation or enlargement is performed on the basis of the center determined according to an alignment mark. These shifting, rotating, and enlarging may be performed individually or performed in any combination in order to hide a defect. The amount of adjustment, such as shifting, rotating, or enlarging is used when forming a pattern on a mask by a mask writing apparatus or when correctly transferring or printing a pattern on a mask onto a wafer with an EUV scanner by referring to the position of an alignment mark and performing adjusting the position relation between a mask and a wafer with reference to the amount of adjustment.

As described above, a mask blank in which the number of defects that cannot be hidden under the light shielding region (a region 44 where the absorber film 12 remains) is less than or equal to a threshold value is searched and extracted from a plurality of mask blanks. It is preferable that the number of EUV exposure mask blanks to be searched is greater than or equal to the inverse of the value obtained by raising the area ratio A of the light shielding region corresponding to a figure pattern to the B-th power, B being the average number of defects. Due to this, it is possible to avoid that all the substrates become NG substrates. For example, if the area ratio of the light shielding region corresponding to a figure pattern is 90% (A=0.9) and the average number of defects of a mask blank is thirty (B=30), the probability K that all the defects are hidden in the absorber film 16 is 4.2% (K=0.042). Therefore, in order to obtain a mask blank in which all defects can be hidden in the absorber film 16, it is sufficient to prepare mask blanks whose number is at least greater than or equal to the inverse (=24, that is twenty-four mask blanks) of the probability K. Therefore, what is necessary is to store, in the mask blank storage device 412, mask blanks whose number N is greater than or equal to the inverse of the value obtained by raising the area ratio A of the light shielding region (absorber film region) corresponding to a figure pattern to the B-th power, B being the average number of defects.

In the selection step (S118), the selection unit 320 selects a mask blank, as a mask blank for writing, in which the number of defects that cannot be hidden under the light shielding region is less than or equal to a threshold value in the determination step (S110). The adjustment unit 318 stores data (shift data) indicating the shift position of the selected mask blank, in the storage device 306. The shift data is output to the writing apparatus 100 by the output unit 324. Moreover, the selection unit 320 outputs identification information (mask blank number etc.) of the selected mask blank to the mask blank storage device 412.

The mask blank storage device 412 takes out a mask blank corresponding to the received identification information on the mask blank. Then, resist is applied to the surface of the mask blank by a resist application device 422, and the mask blank is transmitted to the writing apparatus 100. If resist has already been applied to the mask blank stored in the mask blank storage device 412, it may be transmitted to the writing apparatus 100 from the mask blank storage device 412.

In the writing step (S120), the writing apparatus 100 writes a figure pattern on the searched EUV exposure mask blank using electron beams such that a defect overlaps with the light shielding region (region where the absorber film 12 remains).

Figure 9:
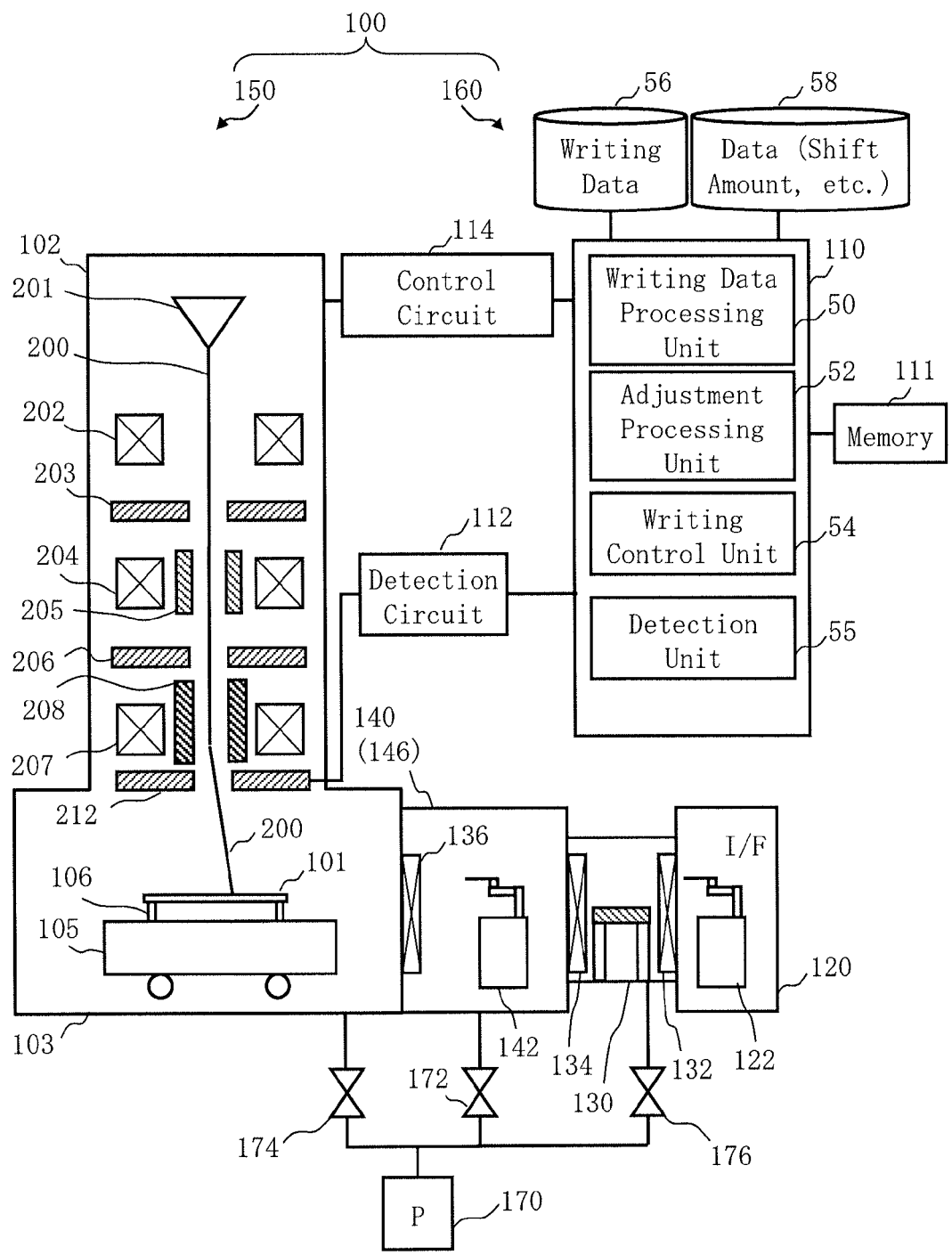
FIG. 9 is a schematic diagram showing a configuration of a writing apparatus according to the first embodiment.

FIG. 9 is a schematic diagram showing the configuration of a writing apparatus according to the first embodiment. In FIG. 9, the writing apparatus 100 is an example of a charged particle beam writing apparatus. In this case, an example of a variable shaping type (VSB) electron beam writing apparatus is particularly shown. The writing apparatus 100 includes a writing unit 150, a control unit 160, an input/output interface (I/F) 120, a load lock (L/L) chamber 130, a robot (R) chamber 140, an alignment (ALN) chamber 146, and a vacuum pump 170. The writing apparatus 100 writes a desired pattern onto a substrate 101 of the selected EUV exposure mask blank, using the electron beams 200.

The writing unit 150 includes an electron optical column 102 and a writing chamber 103. In the electron optical column 102, there are arranged an electron gun assembly 201, an illumination lens 202, a first aperture plate 203, a projection lens 204, a deflector 205, a second aperture plate 206, an objective lens 207, a deflector 208, and a detector 212. In the writing chamber 103, there is movably arranged an XY stage 105. When a pattern is written, a plurality of support pins 106 (examples of a holding unit) are arranged, up and down movably, on the XY stage 105, and the substrate 101 is placed or "supported" on the support pins 106. In the interface unit 120, a transfer robot 122 for carrying out the substrate 101 is arranged. In the robot chamber 140, a transfer robot 142 for transferring the substrate 101 is arranged.

The control unit 160 includes a computer unit 110, a memory 111, a control circuit 114, a detection circuit 112, and storage devices 56 and 58, such as magnetic disk drives. The computer unit 110, the memory 111, the control circuit 114, the detection circuit 112, and the storage devices 56 and 58 are connected with each other through a bus (not shown). There is stored in the storage device 56 writing data defining a figure pattern to be written. It is preferable that the same writing data as that stored in the storage device 302 of the management apparatus 300 is stored. Moreover, shift data of a selected mask blank is stored in the storage device 58.

In the control computer unit 110, there are arranged a writing data processing unit 50, an adjustment processing unit 52 (adjustment being such as shifting, rotating, or reducing), a writing control unit 54, and a detection unit 55. Each function, such as the writing data processing unit 50, the adjustment processing unit 52, the writing control unit 54, and the detection unit 55 may be configured by software such as a program causing a computer to implement these functions, or by hardware such as an electric device or an electronic device. Alternatively, they may be configured by a combination of software and hardware or by a combination of firmware and hardware. Input data and operational processing data processed by each function of the writing data processing unit 50, the adjustment processing unit 52, the writing control unit 54, and the detection unit 55 are stored in the memory 111 each time.

The control circuit 114 is controlled by the writing control unit 54. The control circuit 114 controls and drives each device in the writing unit 150, the input/output interface 120, the L/L chamber 130, the robot chamber 140, and the alignment chamber 146.

The vacuum pump 170 exhausts the gas in the robot chamber 140 and the alignment chamber 146 through a valve 172. Thereby, the insides of the robot chamber 140 and the alignment chamber 146 are maintained to be vacuum atmosphere. The vacuum pump 170 exhausts the gas in the electron optical column 102 and the writing chamber 103 through a valve 174. Thereby, the insides of the electron optical column 102 and the writing chamber 103 are maintained to be vacuum atmosphere. The vacuum pump 170 exhausts the gas in the load lock chamber 130 through a valve 176. Thereby, the inside of the load lock chamber 130 is controlled to be vacuum atmosphere as needed. Gate valves 132, 134, and 136 are placed at each boundary among the interface unit 120, the load lock chamber 130, the robot chamber 140, and the writing chamber 103.

In FIG. 9, configuration elements necessary for explaining the first embodiment 1 are described. Other configuration elements generally necessary for the writing apparatus 100 may also be included. A multiaxial robot can be used as an example of the transfer robots 122 and 142. It is satisfactory for the transfer robots 122 and 142 to be a mechanical system, such as an elevating mechanism or a rotating mechanism.

First, the writing data processing unit 50 reads pattern data stored in the storage device 56, and performs data conversion processing of a plurality of steps so as to generate apparatus specific shot data. In parallel to this processing, detection of an alignment mark (not shown) of a mask blank is performed as described below.

Figure 10:
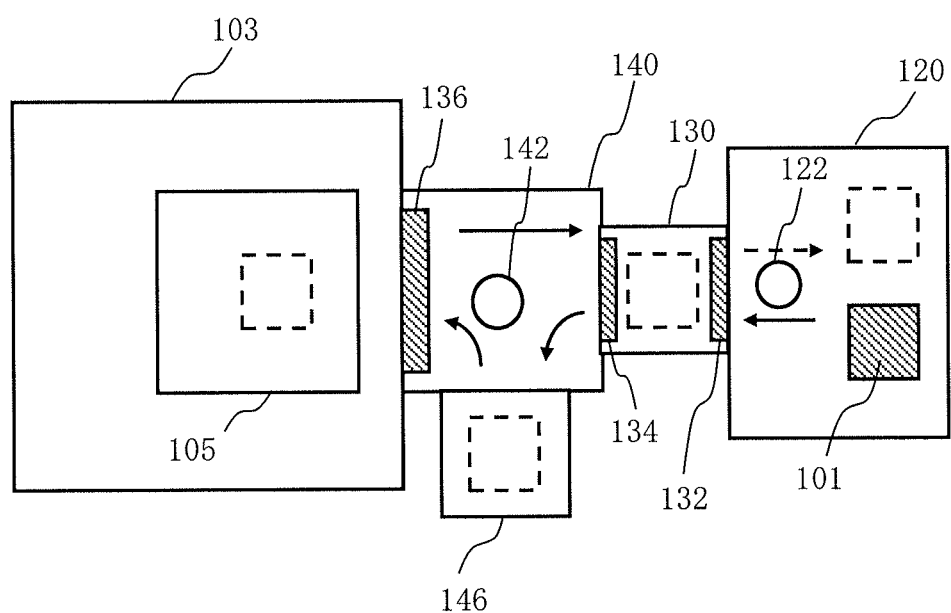
FIG. 10 is a conceptual diagram showing an example of a substrate transfer route in a writing apparatus according to the first embodiment.

FIG. 10 is a conceptual diagram showing an example of a substrate transfer route in a writing apparatus according to the first embodiment. After the gate valve 132 is opened, the substrate 101 arranged at the input/output interface unit 120 is transferred onto the support member in the L/L chamber 130 by the transfer robot 122. Then, after the gate valve 132 is closed, the inside of the L/L chamber 130 is made to be a vacuum atmosphere by the vacuum pump 170. Next, after the gate valve 134 is opened, the substrate 101 arranged on the support member in the L/L chamber 130 is transferred to the stage in the alignment chamber 146 by the transfer robot 142 through the robot chamber 140. Then, the substrate 101 is aligned. Next, after the gate valve 136 is opened, the substrate 101 arranged on the stage in the alignment chamber 146 is transferred to the inside of the writing chamber 103 by the transfer robot 142 through the robot chamber 140. In this way, the substrate 101 is transferred into the writing chamber 103.

In the detection step, the writing unit 150 moves the XY stage 105 to the position at which an alignment mark (not shown) on the substrate 101 can be irradiated by the electron beam 200, and scans over the alignment mark with the electron beam 200 in order to detect the position of the alignment mark on the substrate 101. In this procedure, reflection electrons etc. of the irradiating electron beam 200 is detected by the detector 212 and output to the detection circuit 112. In the detection circuit 112, the position of the alignment mark is converted into a digital signal and output to the computer unit 110. The detection unit 55 detects/acquires the position of the alignment mark by inputting position information on the alignment mark output from the detection circuit 112.

In the shift processing step, the adjustment processing unit 52 (adjustment being such as shifting, rotating, or reducing) performs shifting (offset) of the detected position of the alignment mark (not shown) on the mask blank by a shift amount defined in shift data. Therefore, the position of the alignment mark used as a reference of the writing coordinate system is shifted. Thus, even when using pattern data in which the pattern layout is not configured such that the defect 40 is located in the region 44 where the absorber film 16 remains after patterning, it becomes possible to locate the defect 40 in the region 44 where the absorber film 16 remains after patterning.

Patterns are written onto the substrate 101 in the writing chamber 103. Under the control of the control circuit 114 controlled by the writing control unit 54, the writing unit 150 operates as described below.

The writing unit 150 writes a pattern, with the electron beam 200, on the substrate 101 placed on the support pins 106 in the writing chamber 103. Specifically, the following operation is performed. The electron beam 200 emitted from the electron gun assembly 201, being an example of an emitting unit, irradiates the whole of the first aperture plate 203, which has a quadrangular opening, using the illumination lens 202. At this point, the electron beam 200 is shaped to be a quadrangle. Then, after having passed through the opening of the first aperture plate 203, the electron beam 200 of a first aperture image is projected onto the second aperture plate 206 by the projection lens 204. The position of the first aperture image on the second aperture plate 206 is deflection-controlled by the deflector 205 so as to change the shape and size of the beam. Thereby, the electron beam 200 is formed to be shaped. After having passed through the second aperture plate 206, the electron beam 200 of a second aperture image is focused by the objective lens 207 and deflected by the deflector 208, to reach a desired position on the substrate 101 placed on the XY stage 105 which moves continuously.

After writing and then opening the gate valves 134 and 136, the substrate 101 is transferred onto the support member in the L/L chamber 130 by the transfer robot 142 through the robot chamber 140. After the gate valve 134 is closed, the inside of the L/L chamber 130 is returned to the atmosphere of atmospheric pressure. Then, after the gate valve 132 is opened, the substrate 101 is arranged in the interface unit 120 by the transfer robot 122.

In the development step (S122), the substrate 101 on which a pattern has been written is developed. Thereby, a resist pattern is formed on the substrate 101. That is, in this resist pattern, resist remains at the position where the defect 40 exists. In other words, only the defects 40 whose number is less than or equal to a threshold value exist in the region where resist does not remain.

In the etching step (S124), the antireflection film 18 and the absorber film 16 of the developed substrate 101 are etched by using a resist pattern as a mask. The remaining resist film is removed by ashing. Thereby, forming of an EUV exposure mask has been completed.

As described above, according to the first embodiment, an EUV exposure mask in which defects are included in the region of an absorber pattern can be fabricated.

Figure 11A:
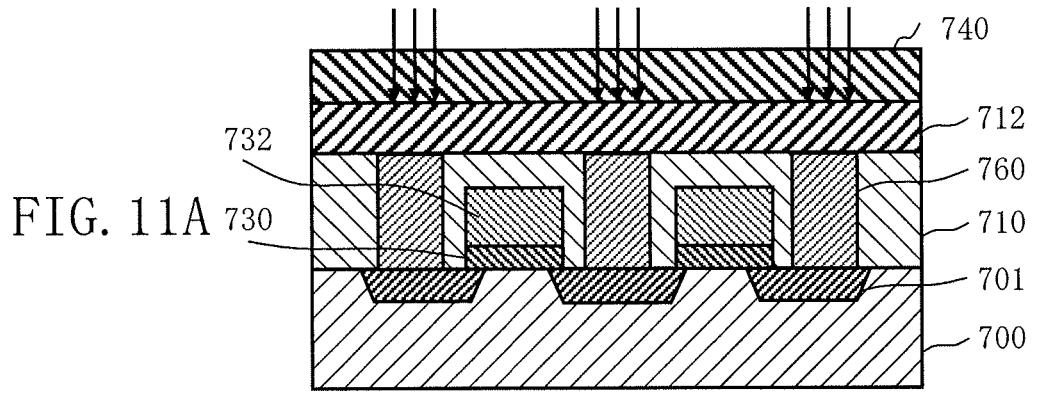
FIGS. 11A to 11C are sectional views showing a part of a fabrication method of a semiconductor device according to the first embodiment.
Figure 11B:
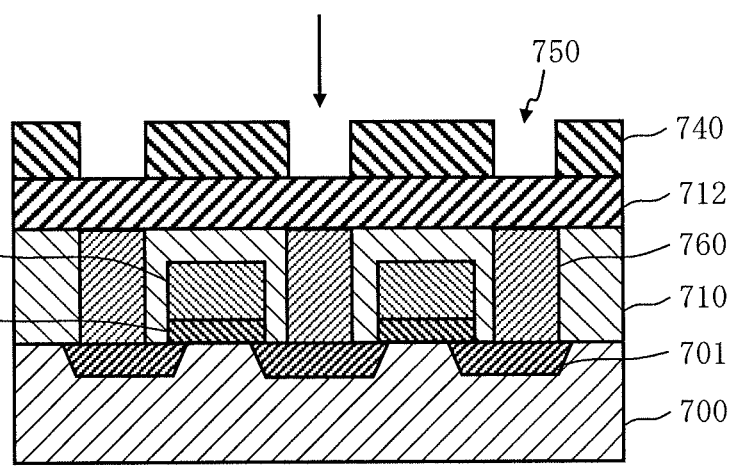
Figure 11C:
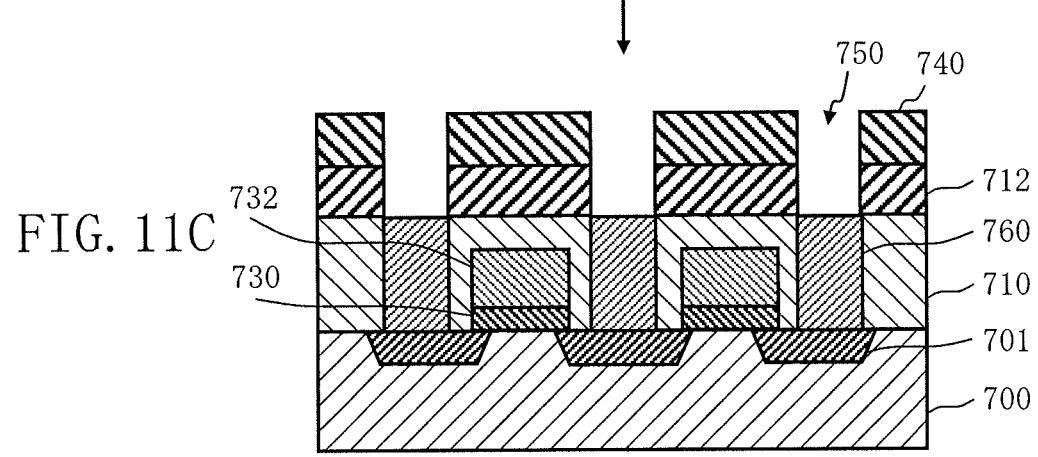

FIGS. 11A to 11C are sectional views showing a part of a fabrication method of a semiconductor device according to the first embodiment. Steps from the transferring (printing) step (S126) to the etching step (S130) are shown in FIGS. 11A to 11C.

In FIG. 11A, a gate insulating film 730 is formed on a semiconductor substrate 700, and a gate electrode 732 is formed on the gate insulating film 730. Moreover, p-type or n-type wells 701 serving as drains or sources are formed at the both sides of the gate electrode 732 of the semiconductor substrate 700. A drain electrode or source electrode 760 is connected to the drain or source. An insulating film 710 is embedded in the perimeter of the gate electrode 732 and the electrode 760. A semiconductor element is formed as described above. On this semiconductor element, an interlayer insulating film 712 of the wiring layer is formed. A resist film 740 is formed on the interlayer insulating film 712. The transferring (printing) step (S126) is performed in this state.

Figure 12:
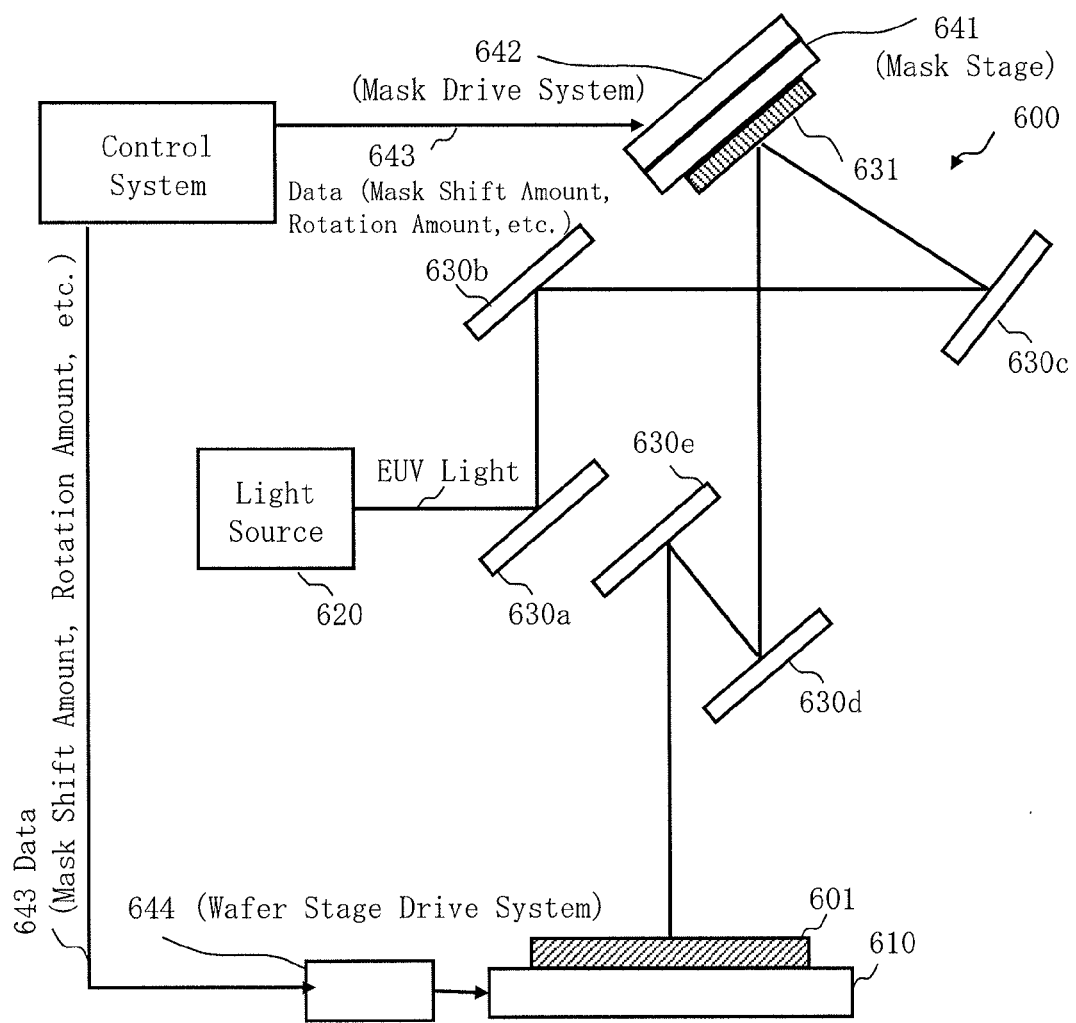
FIG. 12 is a conceptual diagram showing the configuration of an EUV exposure apparatus according to the first embodiment.

FIG. 12 is a conceptual diagram showing the configuration of an EUV exposure apparatus according to the first embodiment. In FIG. 12, in an EUV exposure apparatus 600, an EUV light emitted from the light source 620 is reflected by a plurality of mirrors 630a to 630e and an EUV exposure mask 631 configuring a catoptric system in order to irradiate a semiconductor substrate 601 arranged on a stage 610. The EUV exposure mask 631, which is a part of the catoptric system, is arranged on a mask stage 641. The mask stage 641 is arranged, for example, on a mask drive system 642. Data 643, such as a shift amount and a rotation amount of the EUV exposure mask 631, is transmitted to the mask drive system 642 and a wafer stage drive system 644 from the control system.

For example, it is supposed that all the defects on a blank can be hidden under the light shield by shifting a pattern, from a reference mark, by 1.1 µm in the x direction and 0.2 µm in the y direction on the blank. In that case, with respect to pattern transfer or print with the EUV exposure apparatus, a target pattern can be transferred or printed onto a wafer by performing pattern transfer by setting the EUV exposure mask 631 such that a reference mark moves by −1.1 µm in the x direction and −0.2 µm in the y direction, on the mask stage 641, using the mask drive system 642. Alternatively, a target pattern can be transferred or printed onto the wafer by putting the EUV exposure mask 631 on a reference position on the mask stage 641, and, at the wafer side, setting, using the wafer stage drive system 644, the wafer such that the position where a reference mark is transferred (or transferred virtually) onto the wafer moves by −1.1 µm in the x direction and −0.2 µm in the y direction.

As a second example, it is supposed that all the defects on a blank can be hidden under the light shield by rotating a pattern on the blank by 0.1 degree from the center determined based on a reference mark. In that case, with respect to pattern transfer or print with the EUV exposure apparatus, a target pattern can be transferred or printed onto a wafer by performing pattern transfer by setting the EUV exposure mask 631 to be rotated by −0.1 degree from the center determined based on a reference mark, using the mask drive system 642, on the mask stage 641. Alternatively, a target pattern can be transferred or printed onto the wafer by putting the EUV exposure mask 631 on a reference position on the mask stage 641, and, at the wafer side, adjusting the rotation of the wafer by using the wafer stage drive system 644.

As a third example, it is supposed that all the defects on a blank can be hidden under the light shield by enlarging a pattern on the blank by 1/10000% on the basis of the center determined based on a reference mark. In that case, with respect to pattern transfer or print with the EUV exposure apparatus, a target pattern can be transferred or printed onto a wafer, using the mask drive system 642, by shifting the EUV exposure mask 631 in the direction of an optical axis in order to change the magnification of the EUV exposure mask 631, and contrarily reducing the mask pattern, which has been enlarged by 1/10000%, by the reduction ratio of 1/10000%.

In the transferring (printing) step (S126), using an EUV exposure mask where a figure pattern has been written, the figure pattern is transferred or printed (exposed) onto a semiconductor substrate. In the example of FIG. 12A, pattern transferring is performed using a positive type resist.

In the development step (S128), with reference to FIG. 11B, the semiconductor substrate 700 on which a pattern has been printed (exposed) is developed. Thereby, a resist pattern is formed on the semiconductor substrate 700. In this resist pattern, the resist is opened (an opening 750 is formed) at the position where the drain electrode or source electrode 760 exists.

In the etching step (S130), with reference to FIG. 11C, the exposed interlayer insulating film 712 is etched using the resist pattern as a mask.

FIGS. 13A to 13C are other sectional views showing a part of a fabrication method of a semiconductor device according to the first embodiment. FIGS. 13A to 13C show a wiring forming step (S132).

In the ashing step, with reference to FIG. 13A, the resist film which remains after etching is removed by ashing.

In a wiring material embedding step, with reference to FIG. 13B, first, barrier metal films are formed on the interlayer insulating film 712, and at the bottom and the side wall of the opening 750. It is preferable to use, as a barrier metal film, for example, tantalum (Ta), titanium (Ti), or a nitride film (TaN, TiN) of tantalum (Ta) or titanium (Ti). A copper (Cu) film 762 is formed on the barrier metal film. The barrier metal film is not shown in FIG. 13B.

With reference to FIG. 13C, superfluous Cu film 762 (including the barrier metal film) protruding from the opening 750 is polished and removed by a chemical mechanical polishing (CMP) method. Thereby, Cu wiring connected to the drain electrode or source electrode 760 can be formed.

Although examples of the wiring formation using a damascene method are shown in FIGS. 11A to 11C and FIGS. 13A to 13C, it is not limited thereto.

Figure 14A:
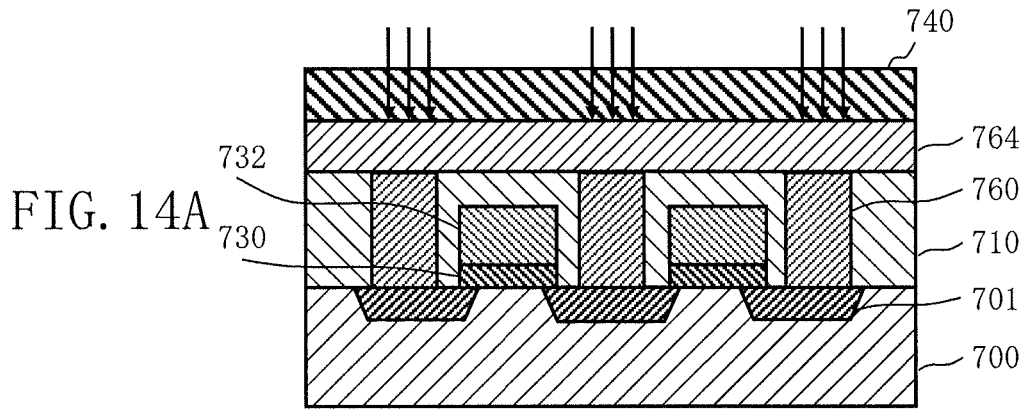
FIGS. 14A to 14C are sectional views showing a part of another fabrication method of a semiconductor device according to the first embodiment.
Figure 14B:
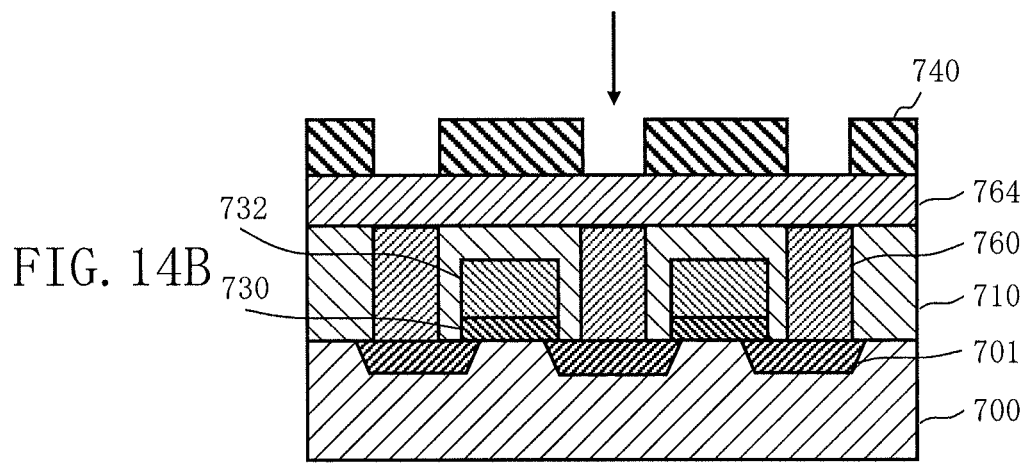
Figure 14C:
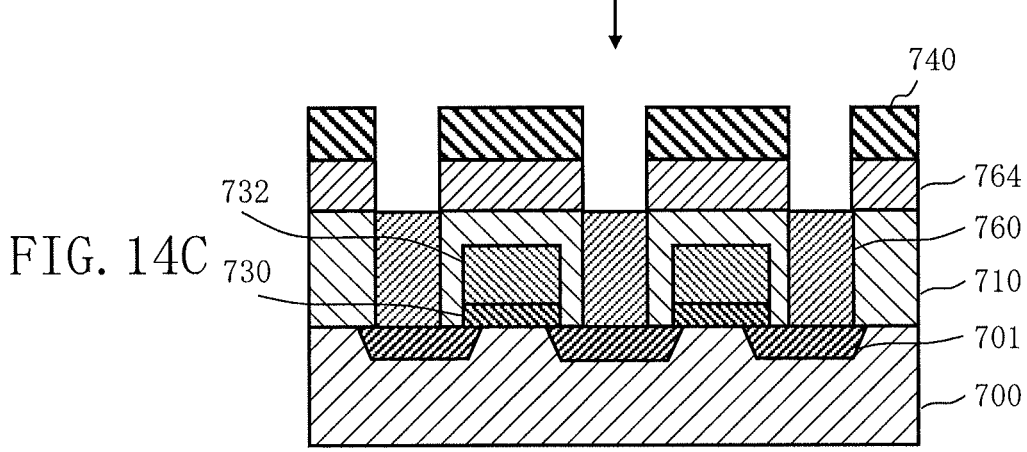

FIGS. 14A to 14C are sectional views showing a part of another fabrication method of a semiconductor device according to the first embodiment. FIGS. 14A to 14C show steps from the transferring (printing) step (S126) to the etching step (S130).

In FIG. 14A, the gate insulating film 730 is formed on the semiconductor substrate 700, and the gate electrode 732 is formed on the gate insulating film 730. Moreover, p-type or n-type wells 701 serving as drains or sources are formed at the both sides of the gate electrode 732 of the semiconductor substrate 700. The drain electrode or source electrode 760 is connected to the drain or source. The insulating film 710 is embedded in the perimeter of the gate electrode 732 and the electrode 760. A semiconductor element is formed as described above. On this semiconductor element, a wiring material film 764 serving as a wiring material of a wiring layer is formed. The resist film 740 is formed on the wiring material film 764. It is preferable to use an aluminum film, for example, as the wiring material film 764. The transferring (printing) step (S126) is performed in this state.

In the transferring (printing) step (S126), using an EUV exposure mask where a figure pattern has been written, the figure pattern is transferred or printed (exposed) onto a semiconductor substrate. In the example of FIG. 14A, pattern transferring is performed using a positive type resist.

In the development step (S128), with reference to FIG. 14B, the semiconductor substrate 700 on which a pattern has been printed (exposed) is developed. Thereby, a resist pattern is formed on the semiconductor substrate 700. In this resist pattern, the resist is opened (the opening 750 is formed) at the position other than the position where the drain electrode or source electrode 760 exists.

In the etching step (S130), with reference to FIG. 14C, the exposed wiring material film 764 is etched using the resist pattern as a mask.

Figure 15:
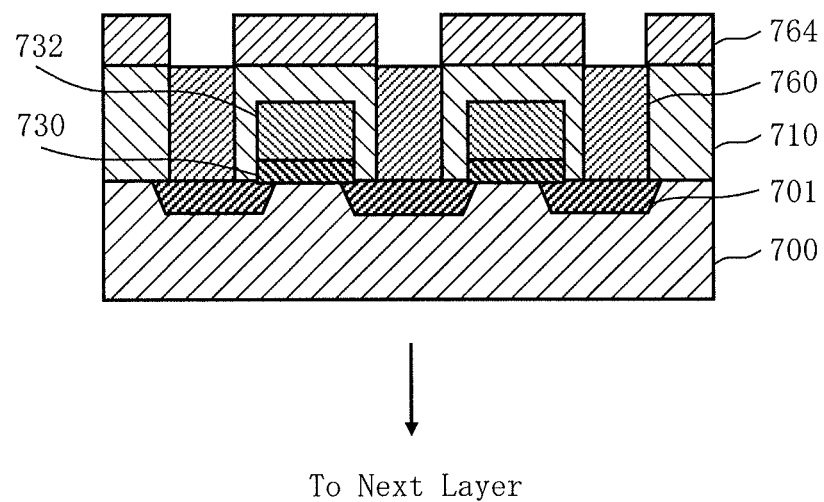
FIG. 15 is another sectional view showing a part of another fabrication method of a semiconductor device according to the first embodiment.
Figure 16:
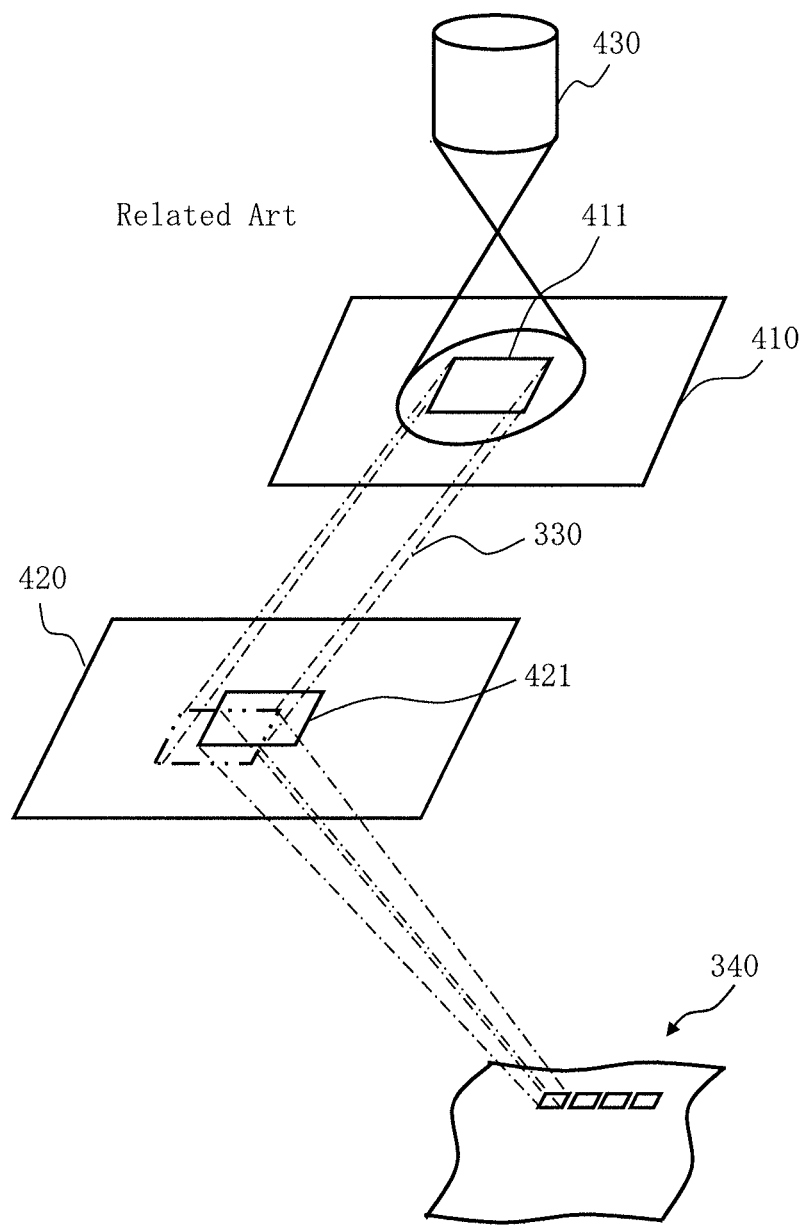
FIG. 16 is a conceptual diagram explaining operations of a variable shaping type electron beam writing apparatus.

FIG. 15 is another sectional view showing a part of another fabrication method of a semiconductor device according to the first embodiment. FIG. 15 shows the wiring forming step (S132).

In the ashing step, with reference to FIG. 15, the resist film which remains after etching is removed by ashing. Thereby, an aluminum wiring connected to the drain electrode or source electrode 760 is formed.

As described above, according to the first embodiment, since the EUV exposure mask in which defects 40 are included in the region of an absorber pattern is used, when exposing a wafer with the fabricated mask, it is possible to avoid to transfer (print) a phase defect, which exists in the mask, onto the wafer. Thus, a pattern in which the influence of a phase defect existing in the EUV mask has been eliminated can be transferred or printed onto the wafer.

The embodiments have been explained referring to concrete examples described above. However, the present invention is not limited to these specific examples.

Moreover, while the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other exposure mask fabrication method, exposure mask fabrication system, semiconductor device fabrication method, charged particle beam writing apparatus, and charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure mask fabrication method comprising:
for each EUV (Extreme Ultra Violet) exposure mask blank in a plurality of EUV exposure mask blanks, measuring and storing defect position data that indicates positions of one or more defects generated in the EUV exposure mask blank;
inputting pattern data which defines a figure pattern to be written;
searching, when the figure pattern is written, in the plurality of EUV exposure mask blanks, for an EUV exposure mask blank on which the figure pattern can be arranged such that a number of defects not being located in a light shielding region is less than or equal to a threshold value, based on an arrangement position of the figure pattern defined in the pattern data, using the defect position data for each EUV exposure mask blank in the plurality of EUV exposure mask blanks; and
if an EUV exposure mask blank is identified on which the figure pattern can be arranged such that the number of defects not being located in the light shielding region is less than or equal to the threshold value, writing the figure pattern on the identified EUV exposure mask blank such that the number of defects not being located in the light shielding region is less than or equal to the threshold value, using a charged particle beam.

2. The method according to claim 1, wherein
a number of EUV exposure mask blanks in the plurality of EUV exposure mask blanks to be searched is greater than or equal to an inverse of a value obtained by raising an area ratio of a light shielding region in a predetermined pattern to be transferred by a scanner to a power of an average number of defects, and
the area ratio of the light shielding region is obtained by dividing an area of the light shielding region by an added area of the light shielding region and an unshielding region.

3. The method according to claim 1, wherein
the searching includes at least one of shifting the arrangement position of the figure pattern, rotating the figure pattern, and reducing the figure pattern if, at the arrangement position of the figure pattern, the number of defects not being located in the light shielding region is not less than or equal to the threshold value.

4. The method according to claim 1, wherein
the searching includes referring to a mask blank storage list stored in a storage device, selecting one mask blank from a plurality of mask blanks defined in the mask blank storage list, and setting the selected mask blank.

5. The method according to claim 4, wherein
the searching includes extracting all defect positions and sizes in the selected mask blank, and comparing a defect position with the arrangement position of the figure pattern by overlapping a defect pattern at each extracted defect position and of each extracted defect size with an arrangement layout of the figure pattern defined in the pattern data.

6. The method according to claim 5, wherein
the searching includes determining whether the number of defects is less than or equal to the threshold value having been set.

7. An exposure mask fabrication system comprising:
a first storage unit configured to, for each EUV (Extreme Ultra Violet) exposure mask blank in a plurality of EUV exposure mask blanks, store defect position data that indicates positions of one or more defects generated in the EUV exposure mask blank;
a second storage unit configured to store pattern data which defines a figure pattern to be written;
a search unit configured, in writing the figure pattern, to search, in the plurality of EUV exposure mask blanks, for an EUV exposure mask blank on which the figure pattern can be arranged such that a number of defects not being located in a light shielding region is less than or equal to a threshold value, based on an arrangement position of the figure pattern defined in the pattern data; and
a writing unit configured to, if an EUV exposure mask blank is identified on which the figure pattern can be arranged such that the number of defects not being located in the light shielding region is less than or equal to the threshold value, write the figure pattern on the identified EUV exposure mask blank such that the number of defects not being located in the light shielding region is less than or equal to the threshold value, using a charged particle beam.

8. The system according to claim 7, wherein
a number of EUV exposure mask blanks in the plurality of EUV exposure mask blanks to be searched is greater than or equal to an inverse of a value obtained by raising an area ratio of a light shielding region in a predetermined pattern to be transferred and printed by a scanner to a power of an average number of defects, and
the area ratio of the light shielding region is obtained by dividing an area of the light shielding region by an added area of the light shielding region and an unshielding region.

9. The system according to claim 7, wherein
the search unit performs at least one of shifting the arrangement position of the figure pattern, rotating the figure pattern, and reducing the figure pattern if, at the arrangement position of the figure pattern, the number of defects not being located in the light shielding region is not less than or equal to the threshold value.

10. A semiconductor device fabrication method comprising:
for each EUV (Extreme Ultra Violet) exposure mask blank in a plurality of EUV exposure mask blanks, measuring and storing defect position data that indicates positions of one or more defects generated in the EUV exposure mask blank;

inputting pattern data which defines a figure pattern to be written;

searching, when the figure pattern is written, in the plurality of EUV exposure mask blanks, for an EUV exposure mask blank on which the figure pattern can be arranged such that a number of defects not being located in a light shielding region is less than or equal to a threshold value, based on an arrangement position of the figure pattern defined in the pattern data, using the defect position data for each EUV exposure mask blank in the plurality of EUV exposure mask blanks;

if an EUV exposure mask blank is identified on which the figure pattern can be arranged such that the number of defects not being located in the light shielding region is less than or equal to the threshold value, writing the figure pattern on the identified EUV exposure mask blank such that the number of defects not being located in the light shielding region is less than or equal to the threshold value, using a charged particle beam; and transferring the figure pattern onto a semiconductor substrate, using the EUV exposure mask blank on which the figure pattern has been written.

11. The method according to claim 10, wherein
a number of EUV exposure mask blanks in plurality of EUV exposure mask blanks to be searched is greater than or equal to an inverse of a value obtained by raising an area ratio of a light shielding region in a predetermined pattern to be transferred and printed by a scanner to a power of an average number of defects, and the area ratio of the light shielding region is obtained by dividing an area of the light shielding region by an added area of the light shielding region and an unshielding region.

12. The method according to claim 10, wherein
the searching includes at least one of shifting the arrangement position of the figure pattern, rotating the figure pattern, and reducing the figure pattern if, at the arrangement position of the figure pattern, the number of defects not being located in the light shielding region is not less than or equal to the threshold value.

* * * * *